US010547330B2

(12) United States Patent
Chen et al.

(10) Patent No.: US 10,547,330 B2
(45) Date of Patent: Jan. 28, 2020

(54) METHOD AND DEVICE IN USER EQUIPMENT AND BASE STATION FOR WIRELESS COMMUNICATION

(71) Applicant: Shanghai Langbo Communication Technology Company Limited, Shanghai (CN)

(72) Inventors: Jin-Hui Chen, Shanghai (CN); Xiaobo Zhang, Shanghai (CN)

(73) Assignee: SHANGHAI LANGBO COMMUNICATION TECHNOLOGY COMPANY LIMITED, Shanghai (CN)

( * ) Notice: Subject to any disclaimer, the term of this patent is extended or adjusted under 35 U.S.C. 154(b) by 0 days.

(21) Appl. No.: 16/177,753

(22) Filed: Nov. 1, 2018

(65) Prior Publication Data
US 2019/0132005 A1 May 2, 2019

(30) Foreign Application Priority Data

Nov. 1, 2017 (CN) .......................... 2017 1 1060184
Nov. 2, 2017 (CN) .......................... 2017 1 1061889

(51) Int. Cl.
*H03M 13/13* (2006.01)
*H04L 1/00* (2006.01)
*H04W 72/04* (2009.01)
*H03M 13/09* (2006.01)
*H04B 7/0413* (2017.01)

(52) U.S. Cl.
CPC ........... *H03M 13/13* (2013.01); *H03M 13/09* (2013.01); *H04L 1/0041* (2013.01); *H04L 1/0048* (2013.01); *H04L 1/0061* (2013.01); *H04L 1/0071* (2013.01); *H04W 72/042* (2013.01); *H04B 7/0413* (2013.01)

(58) Field of Classification Search
CPC ..... H03M 13/13; H03M 13/09; H04L 1/0041; H04L 1/0045; H04L 1/0048; H04L 1/0057; H04L 1/0061; H04L 1/0071; H04W 72/042; H04B 7/0413
See application file for complete search history.

(56) References Cited

U.S. PATENT DOCUMENTS

| 9,337,871 | B2 * | 5/2016 | Li | .......... H03M 13/13 |
| 2018/0220305 | A1 * | 8/2018 | Lei | .......... H04L 5/0053 |
| 2019/0028229 | A1 * | 1/2019 | Yeo | .......... H04L 1/0004 |
| 2019/0173499 | A1 * | 6/2019 | Zheng | .......... H03M 13/6306 |

* cited by examiner

Primary Examiner — Sophia Vlahos
(74) Attorney, Agent, or Firm — Maschoff Brennan

(57) ABSTRACT

The present disclosure discloses a method and device in user equipment and a base station for wireless communication. The base station equipment sequentially generates a first information block, performs first channel coding and transmits a first radio signal, wherein the first information block includes bits in a first sub-information block, the first information block is used to generate L check bits, the first information block and the L check bits are sequentially mapped into the first bit block after being interleaved, the first bit block is used as an input of the first channel coding, the value of the first sub-information-block is related to the Q, the positions of the bits in the first sub-information-block in the first bit block are prior to the check bit whose position is front-most among the L check bits in the first bit block.

20 Claims, 10 Drawing Sheets

METHOD AND DEVICE IN USER EQUIPMENT AND BASE STATION FOR WIRELESS COMMUNICATION

CROSS REFERENCE TO RELATED APPLICATION

This application claims the priority benefit of Chinese Patent Application Serial Number 201711060184.0, filed on Nov. 1, 2017, and 201711061889.4 filed on Nov. 2, 2017, the full disclosure of which is incorporated herein by reference.

BACKGROUND

Technical Field

The present disclosure relates to a method for transmitting radio signals in a wireless communication system, and in particular to a method and device for transmitting channel coding.

Related Art

Polar Codes are coding schemes first proposed by Professor Erdal Arikan from University of Birken in Turkey in 2008, which may realize the code construction method of the capacity of a symmetrical Binary input Discrete Memoryless Channel (B-DMC). At the 3rd Generation Partner Project (3GPP) RAN1#87 conference, the 3GPP determined the use of a Polar code scheme as a control channel coding scheme of the 5G Enhanced Mobile Broadband (eMBB) scenario.

In the traditional Long Term Evolution (LTE) system, different Downlink Control Information (DCI) formats correspond to different numbers of coded bits. User Equipment (UE) performs blind detection on the Physical Downlink Control Channel (PDCCH) carrying the DCI according to all possible DCI formats corresponding to the current transmission mode. The method of receiving the PDCCH causes the number of blind detections on the UE side to increase as the candidate item of the number of bits corresponding to the DCI increases.

SUMMARY

The inventors have found through researches that for a certain number of information bits, both the length of the input bit block corresponding to a channel code based on a polar code and the polar code used are fixed, and the only difference lies in the number of frozen bits. This feature of the polar code may be used to fill the DCI format of different lengths to the bit block of the same length for transmission, and the length corresponding to the DCI format may be obtained by the format identifier field in the DCI. In order to alleviate the burden of blind detection on the UE side, a distributed Cyclic Redundancy Check (CRC) bit is introduced into a channel code based on a polar code, thereby introducing interleaving the DCI bit prior to performing polar code coding. Therefore, an urgent problem to be solved is how to place the format identifier field in the DCI format to determine the number of padding bits as early as possible and use padding bits as frozen bits to improve decoding performance.

In view of the above problem, the present disclosure provides a scheme. It should be noted that, in the case of no conflict, the embodiments of the present disclosure and the features in the embodiments may be combined with each other arbitrarily. For example, embodiments in the base station of the present disclosure and the features in the embodiments may be applied to user equipment, and vice versa.

The present disclosure discloses a method in base station equipment for wireless communication, including:

generating a first information block, wherein the first information block includes K bits consisting of bits in M sub-information-blocks and Q padding bits, where M is a positive integer greater than one, Q is a non-negative integer, and K is a positive integer greater than one;

performing first channel coding, wherein a first bit block is used for an input of the first channel coding, the first channel coding is based on a polar code, the first bit block includes the K bits and L check bits, and the first information block is used to generate the L check bits, where L is a positive integer; and transmitting a first radio signal, wherein the output of the first channel coding is used to generate a first radio signal;

wherein any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the above method has the advantage that the first check bit may be used in the decoding process to determine whether the decoding for the first sub-information-block is correct, thereby improving decoding reliability and reducing the decoding delay of a poor code.

In one embodiment, the polar code is a bit block obtained by multiplying a bit block by a Kronecker Matrix having N rows and N columns, where the N is the nth power of 2, and the n is a positive integer.

In one sub-embodiment, a bit position in the bit block is referred to as a sub-channel, and the sequence number of the sub-channel is the same as the row number of the Kronecker matrix.

In one embodiment, serial decoding is used to decode the polar code.

In one embodiment, the position of a bit in a bit block refers to the sequence number of the bit position in which the bit is located, the sequence number is used to determine the object of the subsequent operation, and the bit position with a smaller sequence number is closer to the front in the bit block.

In one embodiment, the first bit blocks are arranged in an ascending order according to a reliability coefficient corresponding to each bit position, and the smaller reliability coefficient is closer to the front.

In one embodiment, the reliability coefficient is in one-to-one correspondence with the sequence number of the subchannel.

In one embodiment, the first bit blocks are arranged in an ascending order according to the decoding sequence number corresponding to each bit position assumed by the base station equipment, and the first bit block which is decoded earlier is closer to the front.

In one embodiment, the first bit block includes frozen bits, and the position of a bit in the first bit block corresponds to a subchannel in a polar code.

In one embodiment, the first bit block includes frozen bits, the first bit block is used as an input of the polar code, and one bit position in the first bit block corresponds to a row in the Kronecker matrix.

In one embodiment, the first bit block does not include frozen bits, the first bit block is used to generate a fourth bit block, and the fourth bit block includes frozen bits.

In one embodiment, a frozen bit block and the first bit block are sequentially cascaded to obtain a fourth bit block.

In one embodiment, the bit position in the fourth bit block is in one-to-one correspondence with the subchannel.

In one embodiment, one bit position in the fourth bit block corresponds to a row in the Kronecker matrix.

In one embodiment, in the first bit block, at least the bit position where the first check bit is located and the bit position where any one of the other check bits among the L check bits is located are discontinuous.

In one embodiment, the value of the first check bit is only related to the bit in the first bit block whose position is prior to the first check bit among the bits constituting the first information block.

In one embodiment, the value of the first check bit is unrelated to the bit in the first bit block whose position is subsequent to the first check bit among the bits constituting the first information block.

In one embodiment, the position of the bits in the first information block used to generate the first check bit in the first bit block is prior to the first check bit.

In one embodiment, the value of the first check bit is a result of an XOR operation of a bit in the first bit set, the bit in the first bit set is a bit in the first information block, and the position of the bit in the first bit set in the first bit block is prior to the first check bit.

In one embodiment, the P bits are a subset of the first bit set.

In one embodiment, the P bits are used to generate the first check bit.

In one embodiment, the first bit block does not include frozen bits, the bit in the first bit block whose position is prior to the first check bit is used to generate the first check bit, and the first bit block does not include frozen bits, the bit in the first bit block whose position is subsequent to the first check bit is not used to generate the first check bit.

In one embodiment, the first information block consists of the K bits, and the first information block includes bits in the M sub-information-blocks and the Q padding bits.

In one embodiment, the first information block is formed by sequentially cascading the bits in the M sub-information-blocks and the Q padding bits.

In one embodiment, the first information block is formed by sequentially cascading the Q padding bits and the bits in the M sub-information-blocks.

In one embodiment, the positions of the Q padding bits in the first information block are discontinuous.

In one embodiment, the positions of the Q padding bits in the first information block are continuous.

In one embodiment, the first information block includes bits other than the K bits.

In one embodiment, the first information block does not include a check bit.

In one embodiment, the check bit is a parity check bit.

In one embodiment, the check bit is a bit in a convolutional code.

In one embodiment, the check bits are used to determine whether the decoding is correct during the decoding process.

In one embodiment, the M sub-information-blocks correspond to M fields in a DCI, respectively.

In one embodiment, the M sub-information-blocks correspond to M fields in a piece of broadcast information, respectively.

In one embodiment, the first information block is broadcast information, and the M sub-information-blocks correspond to M fields in the broadcast information, respectively.

In one embodiment, the first information block is a piece of Downlink Control Information (DCI).

In one embodiment, the first information block is a piece of Downlink Control Information (DCI) related to uplink transmission.

In one embodiment, the first information block is a piece of Downlink Control Information (DCI) related to downlink transmission.

In one embodiment, the first information block is a DCI related to the UL Grant.

In one embodiment, the first information block indicates control information related to uplink transmission.

In one embodiment, the first information block indicates a time-frequency resource for uplink transmission.

In one embodiment, the first information block indicates a modulation scheme for uplink transmission.

In one embodiment, the first information block indicates a coding scheme for uplink transmission.

In one embodiment, the first information indicates a multi-antenna technical scheme for uplink transmission.

In one embodiment, the first information block is a DCI related to the DL Grant.

In one embodiment, the first information block indicates control information related to downlink transmission.

In one embodiment, the first information block indicates a time-frequency resource for downlink transmission.

In one embodiment, the first information block indicates a modulation scheme for downlink transmission.

In one embodiment, the first information block indicates a coding scheme for downlink transmission.

In one embodiment, the first information block indicates a multi-antenna technical scheme for downlink transmission.

In one embodiment, the first information block is a bit block obtained after interleaving a DCI.

In one embodiment, the second bit block is a bit block obtained by cascading the M information blocks and the Q padding bits, and the first information block is a bit obtained by interleaving the second bit block.

In one embodiment, the second bit block is a bit block obtained after sequentially cascading the M information blocks and the Q padding bits.

In one embodiment, the second bit block is a DCI.

In one embodiment, the M information blocks are M fields in the second bit block.

In one embodiment, the M sub-information-blocks indicate different control content.

In one embodiment, the second sub-information-block is a sub-information-block of the M sub-information-blocks other than the first sub-information block, and the second sub-information-block indicates a time-frequency resource used for subsequent transmission.

In one embodiment, the second sub-information-block indicates a Resource Block (RB) used in downlink transmission.

In one embodiment, the second sub-information-block indicates a Resource Block (RB) used in uplink transmission.

In one embodiment, the second sub-information-block indicates an RB occupied by a physical downlink shared channel.

In one embodiment, the second sub-information-block indicates an RB occupied by a physical uplink shared channel.

In one embodiment, the P bits are continuous in the first information block, the bits in the third sub-information-block are also continuous in the first information block, the sequential relationship between the first sub-information-block and the third sub-information-block in the first information block is related to the number of bits included in the first information block.

In one embodiment, if the number of bits included in the first information block is Q1, the first sub-information-block is prior to the third sub-information block; if the number of bits included in the first information block is Q2, the first sub-information-block is subsequent to the third sub-information block; and Q1 and Q2 are two different positive integers.

In one embodiment, if the number of bits included in the first information block is any positive integer in the first positive integer set, the first sub-information-block is prior to the third sub-information block; if the number of bits included in the first information block is any positive integer in the second positive integer set, the first sub-information-block is subsequent to the third sub-information block; the first positive integer set and the second positive integer set consist of a plurality of positive integers, respectively.

In one embodiment, the third sub-information-block indicates Resource Assignment (RA).

In one embodiment, the third sub-information-block indicates a Resource Block (RB).

In one embodiment, the third sub-information-block is a Carrier Indicator Field (CIF), indicating a carrier.

In one embodiment, the third sub-information-block indicates a Modulation Coding Scheme (MCS).

In one embodiment, the third sub-information-block indicates a Redundancy Version (RV).

In one embodiment, the third sub-information-block is a field in which a New Data Indicator (NDI) is located.

In one embodiment, the third sub-information-block indicates multi-antenna-related configuration information.

In one embodiment, the base station equipment assumes that the receiver of the first radio signal uses the Q padding bits as frozen bits in a channel decoding process.

In one embodiment, the base station equipment assumes that the receiver of the first radio signal uses the Q padding bits as known bits in a channel decoding process.

In one embodiment, Q ensures that the number of bits in the first information block is a target positive integer in the first candidate integer set, the target positive integer is a minimum positive integer not less than the total number of bits in the M sub-information-blocks in the first candidate integer set, and the first candidate integer set consists of a plurality of positive integers.

In one embodiment, the first candidate integer set is default (i.e., no signaling configuration is required).

In one embodiment, any positive integer in the first candidate integer set is no more than 200.

In one embodiment, the first information block does not include padding bits other than the Q padding bits.

In one embodiment, Q is 0, and the first information block consists of the M sub-information-blocks.

In one embodiment, Q is greater than 0, and the values of the Q padding bits are set by default.

In one embodiment, Q is greater than 0, and the value of the Q padding bits are all fixed to zero.

In one embodiment, Q is greater than 0, and the values of the Q padding bits are set by default to be the same as the values of the frozen bits in the first bit block.

In one embodiment, the positions of the Q padding bits in the first bit block are continuous.

In one embodiment, the Q padding bits are Q bits which are front-most in the first bit block.

In one embodiment, the first bit block includes a frozen bit block, and the Q padding bit blocks are Q bits closest to the frozen bit block.

In one embodiment, the first bit block includes a frozen bit block, and the Q padding bit blocks are Q continuous bits closest to the frozen bit block in the first bit block.

In one embodiment, the exclusive OR result of the bits in the first information block is used to generate the L check bits.

In one embodiment, the L check bits are Cyclic Redundancy Check (CRC) bits based on the first information block.

In one embodiment, the L check bits are convolutional codes based on the first information block.

In one embodiment, the L check bits are parity check bits generated based on bits in the first information block.

In one embodiment, a first CRC polynomial is used to determine how to generate the L check bits based on the first information block.

In one embodiment, L is equal to 24.

In one embodiment, L is equal to 16.

In one embodiment, the L check bits are used to verify during the decoding process whether the decoding for the first information block is correct.

In one embodiment, the L check bits are scrambled CRC bits, and the first information block is used to generate the scrambled CRC.

In one embodiment, the scrambled CRC is generated by CRC bits generated based on the first CRC polynomial and the first information block after being subjected to a scrambling operation with a feature sequence.

In one embodiment, the scrambling operation is an exclusive OR operation.

In one embodiment, the feature sequence is specific to user equipment.

In one embodiment, the feature sequence is related to an identifier of user equipment.

In one embodiment, the feature sequence is an identifier of user equipment.

In one embodiment, the bits in the first information block are used to generate the scrambled CRC.

In one embodiment, the bits in the third bit block are sequentially mapped into the first bit block after being interleaved, and the third bit block is the result of sequentially cascading the first information block and the L check bits.

In one embodiment, the first check bit is a check bit whose position is front-most in the third bit block among the L check bits.

In one embodiment, a first interleaving table is used to interleave the third bit block to generate the first bit block.

In one embodiment, the first interleaving table is determined by default.

In one embodiment, the first interleaving table is optional.

In one embodiment, the first interleaving table differs according to the number of bits in the first information block.

In one embodiment, the first interleaving table is one of P1 candidate interleaving tables, and the number of bits in the first information block is used to determine the first interleaving table.

In one embodiment, the value in the first interleaving table is a maximum possible value of the number of bits in the first information block, and the number of bits in the first information block is used to perform an interleaving operation on the first information block and the L check bits using the interleaving table.

In one embodiment, the value in the first interleaving table is the maximum possible value of the number of bits in the first information block, and the difference value between the maximum possible value of the number of bits in the first information block and the number of bits in the first information block is used to perform an interleaving operation on the first information block and the L check bits using the first interleaving table.

In one embodiment, the first interleaving table includes a retrieval column and a numerical column, the retrieval column includes continuous retrieval values that are in one-to-one correspondence with values in the numerical column, the retrieval values are used to sequentially generate bits in the first bit block, the values in the first value set in the numerical column are in one-to-one association with bit positions in the third bit block, the values in the numerical column are arranged in an ascending order according to its corresponding retrieval values, the P bits are P bits associated with a first value subset preceding the value associated with the first check bit in the numerical column, and the first value subset is a subset of the first value set.

In one embodiment, the retrieval value in the retrieval column corresponding to any value in the first value subset is less than the retrieval value corresponding to the first check bit.

In one embodiment, the number of retrieval values included in the first interleaving table is equal to the number of bits in the third bit block, the first value is a value in the numerical column, the bit whose sequence number is equal to the first value in the third bit block is placed in the bit position whose sequence number is equal to the first retrieval value in the first bit block, and the first retrieval value corresponds to the first value in the first interleaving table.

In one embodiment, the number of retrieval values included in the first interleaving table is greater than the number of bits in the third bit block, the first value is a value in the numerical column, the bit with the first sequence number in the third bit block is placed in the bit position corresponding to the second sequence number in the first bit block, the first sequence number is equal to the first value minus the first difference value, the first difference value is the difference value of the number of retrieval values included in the first interleaving table minus the number of bits in the third bit block, the second sequence number corresponds to the first retrieval value, the first retrieval value corresponds to the first value in the first interleaving table, and the first value is not less than the first difference value.

In one embodiment, a value less than the first difference value in the numerical column is not used to interleave bits in the third bit block.

In one embodiment, the positions of the at least two check bits among the L check bits in the first bit block are discontinuous.

In one embodiment, the value of any one of the L check bits is unrelated to the bits whose position is subsequent to the check bit among the first bit block in the first information block.

In one embodiment, the value of any one of the L check bits can only be related to the bits whose position is prior to the check bit among the first bit block in the first information block, without being related to the bits whose position is subsequent to the check bit among the first bit block in the first information block.

In one embodiment, the value of any one of the L check bits is only related to the bits whose position is prior to the check bit among the first bit block in the first information block.

In one embodiment, the first bit block does not include frozen bits.

In one embodiment, the value of the frozen bits is configured by default.

In one embodiment, the frozen bits are used as known bits in the decoding process.

In one embodiment, the first channel coding is based on a Kronecker Matrix having N rows and N columns, where the N is the nth power of 2, and the n is a positive integer.

In one embodiment, there is an operation of multiplying a bit block by a Kronecker matrix in the first channel coding.

In one embodiment, the polar code refers to using the result of multiplying a fifth bit block of length N by a Kronecker Matrix having N rows and N columns as an output of a polar code, and the fifth bit block includes the K bits, and the L check bits and frozen bits.

In one embodiment, the fifth bit block consists of all bits in the first information block, the L check bits and frozen bits.

In one embodiment, the fifth bit block consists of the K bits, the L check bits, and N-K-L frozen bits.

In one embodiment, the fifth bit block includes non-frozen bits other than the K bits and the L check bits, and the number of frozen bits included in the fifth bit block is less than N-K-L.

In one embodiment, the Q padding bits are Q continuous bits closest to the frozen bit block among the fourth bit block.

In one embodiment, the frozen bit block and the first bit block are sequentially cascaded to generate the fourth bit block of length N, the bits in the fourth bit block are arranged in an ascending order according to reliability coefficients, the positions of the bits in the fourth bit block are in one-to-one correspondence with N reliability coefficients, respectively, the N reliability coefficients are in one-to-one correspondence with the sequence numbers of the N subchannels, respectively, the bits in the fourth bit block are placed on the subchannel corresponding to their position, the bits on the N subchannels are arranged in an ascending order according to the sequence numbers of the N subchannels to form a fifth bit block, and the fifth bit block is multiplied by a Kronecker Matrix having N rows and N columns used by the polar code to obtain the output of the polar code, where the N is the nth power of 2, and the n is a positive integer.

In one embodiment, the first channel coding further includes rate matching.

In one embodiment, the first channel coding includes the generation of the fourth bit block, the generation of the fifth bit block, the polar code and the rate matching.

In one embodiment, the first channel coding consists of the generation of the fourth bit block, the generation of the fifth bit block, the polar code and the rate matching.

In one embodiment, the first radio signal is an output after the first bit block is sequentially subjected to channel coding, scrambling, a modulation mapper, a layer mapper, precoding, a resource element mapper, and wideband symbol generation.

In one embodiment, the first radio signal is an output after the first bit block is sequentially subjected to channel coding, scrambling, a modulation mapper, a layer mapper, a transform precoder (which is configured to generate a complex value signal), precoding, a resource element mapper, and wideband symbol generation.

In one embodiment, the first radio signal is transmitted on a Physical Broadcast Channel (PBCH).

In one embodiment, the first radio signal is transmitted on a Physical Downlink Control Channel (PDCCH).

In one embodiment, the first radio signal is transmitted on an Enhanced Physical Downlink Control Channel (EPDCCH).

In one embodiment, the first radio signal is transmitted on a physical control channel.

In one embodiment, the sequential order in which the bits in the first information block are in the first information block is different from the sequential order in which the bits in the first information block are in the first bit block.

In one embodiment, at least two continuous bits in the first information block are distributed (i.e., discontinuous) in the first bit block.

In one embodiment, the first bit block is a result of reordering bits in the first information block and the L check bits.

In one embodiment, the first bit block is a result of mixing and reordering bits in the first information block, the L check bits and frozen bits.

In one embodiment, all the sub-information-blocks other than the first sub-information-block among the M sub-information-blocks are unrelated to the value of Q.

In one embodiment, the sub-information-blocks other than the first sub-information-block among the M sub-information-blocks are not used to indicate the value of Q.

In one embodiment, the bits other than the P bits in the first information block are unrelated to the value of Q.

In one embodiment, the bits other than the P bits in the first information block are not used to indicate the value of Q.

In one embodiment, the value of the first sub-information-block indicates an information format of the first information block.

In one embodiment, the information format of the first information block is a candidate format of K1 candidate formats, and the value of the first sub-information-block indicates the format of the first information block from K1 candidate formats, where the K1 is a positive integer greater than one.

In one embodiment, the value of the first sub-information-block is a retrieval of an information format of the first information block in K1 candidate formats, where K1 is a positive integer greater than one.

In one embodiment, the information format of the first information block is a candidate format of K1 candidate formats, and the value of the first sub-information-block in a certain numerical range is in one-to-one correspondence with the K1 candidate formats, where K1 is a positive integer greater than one.

In one embodiment, the value of the first sub-information-block indicates Q.

In one embodiment, Q is a candidate value of K2 candidate values, and the value of the first sub-information-block indicates Q from the K2 candidate values, where K2 is a positive integer greater than 1.

In one embodiment, the value of the first sub-information-block is a number of Q in K2 candidate values, where K2 is a positive integer greater than one.

In one embodiment, Q is a candidate value of K2 candidate values, and the value of the first sub-information-block in a certain numerical range is in one-to-one correspondence with K2 candidate formats, where K2 is a positive integer greater than one.

In one embodiment, the information format of the first information block is used to determine Q.

In one embodiment, the first information block is Downlink Control Information (DCI), and the information format of the first information block is a DCI format of the first information block.

In one embodiment, the value of the first sub-information-block is combined with the second information to determine the value of Q.

In one embodiment, the second information refers to the number of subcarriers.

In one embodiment, the second information refers to a multi-antenna mode.

In one embodiment, the second information refers to a modulation and coding format.

In one embodiment, the second information refers to a carrier frequency band.

In one embodiment, the base station equipment transmits a second radio signal, and the second radio signal indicates the second information.

In one embodiment, the value of the first sub-information-block is used to determine the first format as the format of the first information block among the K1 candidate formats, and the second information is used to determine the value of Q from among the K2 candidate values corresponding to the first format, where both K1 and K2 are positive integers greater than one.

According to an aspect of the present disclosure, the method includes:
determining the position of the P bits in the first information block;
wherein the position of the P bits in the first information block ensures that the positions of the P bits in the first bit block are prior to the first check bit.

In one embodiment, the number of bits in the first information block is used to determine the position of the P bits in the first information block.

In one embodiment, the number of bits in the first information block is in one-to-one correspondence with the position of the P bits in the first information block, respectively.

In one embodiment, the first information format set in which the first information block is located is used to determine the position of the P bits in the first information block, and the number of bits corresponding to the information format in the first information format set is the same.

In one embodiment, the position of the P bits in the first information block is related to the number of bits in the first information block.

In one embodiment, the bit whose position is subsequent to the first check bit in the first bit block cannot be any one of the P bits.

In one embodiment, the bit whose position is subsequent to the first check bit in the first bit block is not used to determine the value of Q.

In one embodiment, the bit whose position is subsequent to the first check bit in the first bit block is not used to determine the format of the first information block.

According to an aspect of the present disclosure, the positions of the P bits in the first bit block are continuous, and the positions of the P bits in the first information block are also continuous.

In one embodiment, the above method has the advantages of facilitating the clarity of the specification and the ease of operation, and ensuring that all the positions of the P bits in the first bit block are prior to the first check bit.

In one embodiment, the number of bits in the first information block is one of K1 candidate values, in the information format corresponding to any one of the K1 candidate values, the positions of the P bits in the first bit block are continuous, and the positions of the P bits in the first information block are also continuous, where K1 is a positive integer greater than one.

In one embodiment, the formal of the first information block is one of K2 candidate formats, in any one of the K2 candidate formats, the positions of the P bits in the first bit block are continuous, and the positions of the P bits in the first information block are also continuous, where K2 is a positive integer greater than one.

In one embodiment, the first information block includes a first bit and a second bit that are continuous in position in the first information block, the first bit and the second bit are discontinuous in position in the first bit block, and the P bits cannot simultaneously include the first bit and the second bit.

In one embodiment, the first value subset consists of P values in which both the retrieval values and the values are continuous.

According to an aspect of the present disclosure, the P bits are P bits whose position is front-most in the first bit block among the bits constituting the first information block.

In one embodiment, the above method has the advantage of ensuring that the bits for indicating the number of padding bits are decoded as soon as possible to determine the number of padding bits as early as possible, reducing the decoding delay.

In one embodiment, the base station equipment assumes that the bits whose position is closer to the front in the first bit block are decoded earlier in the decoding process.

In one embodiment, the bits in the first bit block are arranged in an ascending order of reliability.

In one embodiment, the retrieval values corresponding to the values in the first value subset are minimum P retrieval values among the retrieval values corresponding to the values in the first value set.

In one embodiment, the first bit block is multiplied by a Kronecker Matrix to obtain an output of the first channel coding.

According to an aspect of the present disclosure, the P bits are the P bits that are positioned last in the first information block.

In one embodiment, the above method has the advantage of facilitating the design, ensuring the continuity of the bit field for indicating the information format in the DCI, and improving the reliability of the bit field for indicating the information format.

In one embodiment, the information format of the first information block is any one of K1 candidate information formats, where K1 is a positive integer greater than 1.

In one embodiment, the number of bits in the first information block is one of K2 values, K2 is a positive integer greater than 1, in the information format of the first information block corresponding to any one of the K2 values, the P bits are the P bits that are positioned last.

In one embodiment, in the first information block, the positions of the Q padding bits are prior to the P bits.

In one embodiment, Q is a positive integer, and the P bits are adjacent to the Q padding bits.

In one embodiment, the positions of the P bits in the first information block are continuous.

In one embodiment, the positions of bits other than the P bits in the first information block are prior to the P bits.

In one embodiment, the P bits are adjacent to the first check bit in the first bit block.

According to an aspect of the present disclosure, the position of the P bits in the first information block is related to the number of bits in the first information block.

In one embodiment, the above method has the advantage of optimizing the bit field for indicating the information format for the DCI including a different number of bits according to the interleaving table, thereby satisfying the multi-directional requirement.

In one embodiment, the corresponding values of the P bits in the first interleaving table are determined by default.

In one embodiment, the corresponding values of the P bits in the first interleaving table are related to the number of bits in the first information block.

In one embodiment, the corresponding retrieval values of the P bits in the first interleaving table are determined by default.

In one embodiment, the corresponding retrieval values of the P bits in the first interleaving table are related to the number of bits in the first information block.

In one embodiment, the positions of the P bits in the first bit block are determined by default.

In one embodiment, the positions of the P bits in the first bit block are related to the number of bits in the first information block.

According to an aspect of the present disclosure, the relative positions between the P bits and the first check bit in the first bit block is unrelated to the number of bits in the first information block In one embodiment, the above method has the advantage of facilitating the clarity of the specification and controlling the reliability of the P bits.

In one embodiment, the P bits are the P bits closest to the first check bit prior to the first check bit in the first bit block.

In one embodiment, at least one of the P bits does not belong to one of the P bits closest to the first check bit prior to the first check bit in the first bit block.

In one embodiment, the number of bits in the first information block is one of K2 candidate values, K2 is a positive integer greater than 1, and the number of bits in the first information block is not a value other than the K2 candidate values.

In one embodiment, the first interleaving table is used to sequentially map the first information block and the L check bits into the first bit block after being interleaved, the second value set is a subset of the first value set, the value in the second value set is prior to the value associated with the first check bit, for any one of the K2 candidate values equal to the number of bits in the first information block, the second value set is present, the P bits correspond to a second value subset including P values, the second value subset is a subset of the second value set, the values of the second value subset are unrelated to the number of bits in the first information block, and the positions of the P bits in the first bit block are in one-to-one correspondence with the retrieval values corresponding to the second value subset.

In one embodiment, the second value subset is the front-most P values of the second value set.

In one embodiment, the second value subset is the last P values of the second value set.

In one embodiment, the second value subset is continuous P values of the second value set.

In one embodiment, the relative positions between the P bits and the first check bit in the first bit block refers to the number of bits between the bit position in which any one of the P bits is located in the first bit block and the bit position in which the first check bit is located in the first bit block.

In one embodiment, the relative positions between the P bits and the first check bit in the first bit block refers to the difference value between the sequence number in which any one of the P bits is located in the first bit block and the sequence number in which the first check bit is located in the first bit block.

In one embodiment, the relative positions of the P bits and the first check bit in the first bit block are fixed.

In one embodiment, in the first interleaving table, the retrieval values corresponding to the P bits are P retrieval values closest to the retrieval value corresponding to the first check bit, and the P retrieval values are less than the retrieval value corresponding to the first check bit.

In one embodiment, in the first information block, the relative position between the P bits and the first check bit is related to the number of bits in the first information block.

According to an aspect of the present disclosure, the relative positions between the P bits and the first check bit in the first bit block is related to the number of bits in the first information block.

In one embodiment, the above method has the advantage of facilitating the clarity of the specification and the performance optimization by adjusting the bit position where the bit identifier field according to the payload size of the DCI.

In one embodiment, if the number of bits in the first information block is Q1, there are P1 bits between the last bit position of the P bits in the first bit block and the bit position where the first check bit is located; if the number of bits in the first information block is Q2, there are P2 bits between the last bit position of the P bits in the first bit block and the bit position where the first check bit is located; Q1 and Q2 are two unequal positive integers greater than 1, and P1 and P2 are two unequal positive integers.

In one embodiment, the third bit is one of the P bits, and if the number of bits in the first information block is Q1, there are P1 bits between the third bit and the bit position where the first check bit is located; if the number of bits in the first information block is Q2, there are P2 bits between the third bit and the bit position where the first check bit is located; the Q1 and the Q2 are two unequal positive integers greater than 1, and the P1 and the P2 are two unequal positive integers.

According to an aspect of the present disclosure, the positions of the Q padding bits in the first information block are discontinuous.

In one embodiment, the above method has the advantage of further improving the decoding performance by optimizing the distribution of the Q padding bits in the first information block.

In one embodiment, the positions of the P bits in the first information block are continuous, and the distribution of the Q padding bits in the first information block is used to ensure that the positions of the bits in any one of the M sub-information-blocks in the first information block are continuous.

In one embodiment, the P bits are the front-most P bits in the first bit block, and the distribution of the Q padding bits in the first information block is used to ensure that the P bits are the front-most P bits of the first bit block.

In one embodiment, the P bits are P bits closest to the first check bit in the first bit block, and the distribution of the Q padding bits in the first information block is used to ensure that the P bits are P bits closest to the first check bit in the first bit block.

In one embodiment, the first bit block does not include frozen bits, one frozen bit block and the first bit block are sequentially cascaded to generate a third bit block, and the distribution of the Q padding bits in the first information block is used to ensure that the Q padding bits are the front-most Q bits in the first bit block.

In one embodiment, the first bit block includes a frozen bit block, and the distribution of the Q padding bits in the first information block is used to ensure that the Q padding bits are Q bits closest to the frozen bit block in the first bit block.

In one embodiment, the subchannels corresponding to the Q padding bits are the least reliable Q subchannels among the subchannels corresponding to the bits in the first information block.

In one embodiment, the bits in the first bit block are arranged in an ascending order according to reliability coefficients, and the distribution of the Q padding bits in the first information block is used to ensure that the Q padding bits are the front-most Q bits in the first bit block.

The present disclosure discloses a method in user equipment for wireless communication, including:

receiving a first radio signal, wherein the first radio signal is used for an input of first channel decoding;

performing first channel decoding, wherein the first channel decoding corresponds to first channel coding, the first channel coding is based on a polar code, and a first bit block is used for an input of the first channel coding; and recovering a first information block, wherein the first information block includes K bits consisting of bits in M sub-information-blocks and Q padding bits, the first bit block includes the K bits and L check bits, and the first information block is used to generate the L check bits, where M and K are both positive integers greater than 1, Q is a non-negative integer, and L is a positive integer;

wherein any one of the M sub-information-blocks consists of a positive integer number of bits, the first sub-information-block is a sub-information-block of the M sub-information-blocks, and the first sub-information-block consists of P bits, where the P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first hit block are hits in the first information block.

In one embodiment, the first channel decoding is serial channel decoding.

In one embodiment, a Successive Cancellation List (SCL) is used in the first channel decoding to decode the polar code.

In one embodiment, a Successive Cancellation Stack (SCS) is used in the first channel decoding to decode the polar code.

In one embodiment, the first channel decoding is used to recover the first bit block.

In one embodiment, the first channel decoding is used to recover soft bits corresponding to the first bit block.

In one embodiment, bit reordering is extracted from the first bit block to recover the first information block.

In one embodiment, the first bit block is deinterleaved to recover the first information block.

In one embodiment, the first channel decoding recovers P bits prior to recovering all bits in the first information block.

In one embodiment, the P bits are used by the first channel decoding to recover bits in the first information block.

In one embodiment, after the first channel decoding is used to recover the P bits, the user equipment continues to use the first channel decoding for decoding with the Q padding bits indicated by the first sub-information-block as frozen bits, thereby recovering the bits in the first information block.

In one embodiment, after the first channel decoding is used to recover the P bits, the user equipment continues to use the first channel decoding for decoding with its corresponding Q padding bits as frozen bits according to the information format of the first information block indicated by the first sub-information block, thereby recovering the bits in the first information block.

In one embodiment, the first check bit is used to verify whether the decoding for the first sub-information-block is correct.

In one embodiment, the first channel decoding first recovers the first check bit and the first bit set prior to the first check bit in the first bit block, the P bits arc the bits in the first hit set, and the user equipment assumes that the first bit set is used to generate the first check bit and the bits other than the first bit set are not used to generate the first check bit. The first channel decoding uses the first check bit to determine whether the decoding of the first bit set is correct. If the first bit set passes the check of the first check bit, the P bits are used to determine the value of Q and the position of the Q padding bits in the first information block, the first channel decoding uses the Q padding bits as Q frozen bits to decode non-padding bits and the L check bits in the first information block.

In one embodiment, if the first bit set does not pass the check of the first check bit, the user equipment stops the decoding operation of the first information block.

In one embodiment, the user equipment assumes that the first check bit is an exclusive OR result of bits of the first bit set.

In one embodiment, the user equipment assumes that a CRC polynomial is used to generate a CRC bit block for the first information block, the CRC bit block includes the L check bits, and the first check bit is a first bit in the CRC bit block.

According to one aspect of the present disclosure, the method includes:

obtaining the P bits by decoding;

wherein the positions of the P bits in the first bit block are prior to the first check bit.

In one embodiment, at least one of the bits other than the P bits in the first information block is obtained after decoding the P bits.

In one embodiment, the value of the first sub-information-block is used to decode the bits other than the P bits in the first information block.

In one embodiment, the value of the first sub-information-block is used to determine the format of the first information block.

In one embodiment, the value of the first sub-information-block is used to determine the value of Q and the position of the Q padding bits in the first information block.

According to an aspect of the present disclosure, the positions of the P bits in the first bit block are continuous, and the positions of the P bits in the first information block are also continuous.

According to an aspect of the present disclosure, the P bits are P bits whose position is front-most in the first bit block among the bits constituting the first information block.

According to an aspect of the present disclosure, the P bits are the P bits that are positioned last in the first information block.

According to an aspect of the present disclosure, the position of the P bits in the first information block is related to the number of bits in the first information block.

According to an aspect of the present disclosure, the relative positions between the P bits and the first check bit in the first bit block is unrelated to the number of bits in the first information block.

According to an aspect of the present disclosure, the relative positions between the P bits and the first check bit in the first bit block is related to the number of bits in the first information block.

According to an aspect of the present disclosure, the positions of the Q padding bits in the first information block are discontinuous.

The present disclosure discloses base station equipment for wireless communication, including:

a first processor module configured to generate a first information block, wherein the first information block includes K bits consisting of bits in M sub-information-blocks and Q padding bits, where M is a positive integer greater than one, Q is a non-negative integer, and K is a positive integer greater than one;

a first channel encoder configured to perform first channel coding, wherein a first bit block is used for an input of the first channel coding, the first channel coding is based on a polar code, the first bit block includes the K bits and the L check bits, and the first information block is used to generate the L check bits, where L is a positive integer; and a first transmitter module configured to transmit a first radio signal, wherein the output of the first channel coding is used to generate a first radio signal;

wherein any one of the M sub-information-blocks consists of a positive integer number of bits, the first sub-information-block is a sub-information-block of the M sub-information-blocks, and the first sub-information-block consists of P bits, where the P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the above base station equipment is characterized in that the first processor module determines the position of the P bits in the first information block; wherein the position of the P bits in the first information block ensures that the positions of the P bits in the first bit block are prior to the first check bit.

In one embodiment, the above base station equipment is characterized in that the positions of the P bits in the first bit block are continuous, and the positions of the P bits in the first information block are also continuous.

In one embodiment, the above base station equipment is characterized in that the P bits are P bits whose position is front-most in the first bit block among the bits constituting the first information block.

In one embodiment, the above base station equipment is characterized in that the P bits are the P bits that are positioned last in the first information block.

In one embodiment, the above base station equipment is characterized in that the position of the P bits in the first information block is related to the number of bits in the first information block.

In one embodiment, the above base station equipment is characterized in that the relative positions between the P bits and the first check bit in the first bit block is unrelated to the number of bits in the first information block.

In one embodiment, the above base station equipment is characterized in that the relative positions between the P bits and the first check bit in the first bit block is related to the number of bits in the first information block.

In one embodiment, the above base station equipment is characterized in that the positions of the Q padding bits in the first information block are discontinuous.

The present disclosure discloses user equipment for wireless communication, including:

a first receiver module configured to receive a first radio signal, wherein the first radio signal is used for an input of first channel decoding;

a first channel decoder configured to perform first channel decoding, wherein the first channel decoding corresponds to first channel coding, the first channel coding is based on a polar code, and a first bit block is used for an input of the first channel coding; and a second processor module configured to recover a first information block, wherein the first information block includes K bits consisting of bits in M sub-information-blocks and Q padding bits, the first bit block includes the K bits and L check bits, and the first information block is used to generate the L check bits, where M and K are both positive integers greater than 1, Q is a non-negative integer, and L is a positive integer;

wherein any one of the M sub-information-blocks consists of a positive integer number of bits, the first sub-information-block is a sub-information-block of the M sub-information-blocks, and the first sub-information-block consists of P bits, where the P is a positive integer; the value of the first sub-information-block is related to the information format of the first information block, or the value of the first sub-information-block is related to Q; the first information block and the L check bits are sequentially mapped into the first bit block after being interleaved, the positions of the P hits in the first hit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the above user equipment is characterized in that the first channel decoder obtains the P bits by decoding; wherein the positions of the P bits in the first bit block are prior to the first check bit.

In one embodiment, the above user equipment is characterized in that the positions of the P bits in the first bit block are continuous, and the positions of the P bits in the first information block are also continuous.

In one embodiment, the above user equipment is characterized in that the P bits are P bits whose position is front-most in the first bit block among the bits constituting the first information block.

In one embodiment, the above user equipment is characterized in that the P bits are the P bits that are positioned last in the first information block.

In one embodiment, the above user equipment is characterized in that the position of the P bits in the first information block is related to the number of bits in the first information block.

In one embodiment, the above user equipment is characterized in that the relative positions between the P bits and the first check bit in the first bit block is unrelated to the number of bits in the first information block.

In one embodiment, the above user equipment is characterized in that the relative positions between the P bits and the first check bit in the first bit block is related to the number of bits in the first information block.

In one embodiment, the above user equipment is characterized in that the positions of the Q padding bits in the first information block are discontinuous.

In one embodiment, the present disclosure has the following advantages over the conventional scheme:

using the characteristics of the Polar code serial decoding to reduce the number of blind detections on the UE side by the internal indication of the code block;

supporting more flexible and diverse DCI formats;

using padding bits as frozen bits to improve decoding performance;

using check bits to improve the reliability of the format indicator field;

optimizing system performance by optimizing the position of the indication information of the information format.

BRIEF DESCRIPTION OF THE DRAWINGS

Other features, objects and advantages of the present disclosure will become more apparent from the detailed description of non-restrictive embodiments taken in conjunction with the following drawings.

DESCRIPTION OF THE EMBODIMENTS

The technical schemes of the present disclosure will be further described in detail below with reference to the accompanying drawings. It should be noted that the embodiments of the present disclosure and the features in the embodiments may be combined with each other without conflict.

Embodiment 1

Figure 1:
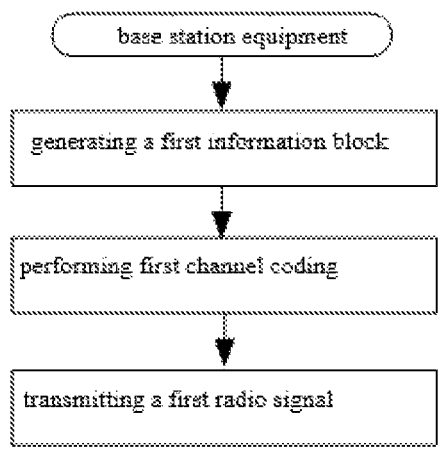
FIG. 1 is a flow chart illustrating a first information block, first channel coding and a first radio signal according to one embodiment of the present disclosure.

Embodiment 1 illustrates a first information block, first channel coding and a first radio signal according to the present disclosure, as shown in FIG. 1. In FIG. 1, each block represents a step. In Embodiment 1, the base station equipment in the present disclosure sequentially generates a first information block, performs first channel coding, and transmits a first radio signal; wherein the first information block includes K bits consisting of bits in M sub-information-blocks and Q padding bits, where M is a positive integer greater than one, Q is a non-negative integer, and K is a positive integer greater than one; a first bit block is used for an input of the first channel coding, the first channel coding is based on a polar code, the first bit block includes the K bits and L check bits, and the first information block is used to generate the L check bits, where L is a positive integer; the output of the first channel coding is used to generate a first radio signal; any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the polar code refers to using the result of multiplying a fifth bit block of length N by a Kronecker Matrix having N rows and N columns as an output of a polar code, and the fifth bit block includes the K bits, and the L check bits and frozen bits.

In one embodiment, the first bit block does not include frozen bits, and one frozen bit block and the first bit block are sequentially cascaded to generate a fourth bit block.

In one embodiment, the bits in the fourth bit block are arranged in an ascending order according to reliability coefficients.

The positions of the bits in the fourth bit block are in one-to-one correspondence with N reliability coefficients, respectively, the N reliability coefficients are in one-to-one correspondence with the sequence numbers of the N subchannels, respectively, the bits in the fourth bit block are placed on the subchannel corresponding to their position, and the bits on the N subchannels are arranged in an ascending order according to the sequence numbers of the N subchannels to form a fifth bit block.

In one embodiment, the fifth bit block is used as an input of the polar code.

In one embodiment, the first information block is a DCI block.

In one embodiment, a PDCCH is used to transmit the first information block.

In one embodiment, the first sub-information-block indicates an information format of the first information block, and the information format of the first information block is used to determine Q.

In one embodiment, the sequential order in which the bits in the first information block are in the first information block is different from the sequential order in which the bits in the first information block are in the first bit block.

In one embodiment, the first information block and the L check bits are sequentially cascaded to generate a third bit block, and the first interleaving table is used to interleave the third bit block to generate the first bit block.

In one embodiment, the first interleaving table includes a retrieval column and a numerical column, the retrieval column includes continuous retrieval values that are in one-to-one correspondence with values in the numerical column, the retrieval values are used to sequentially generate bits in the first bit block, the values in the first value set in the numerical column are in one-to-one association with bit positions in the third bit block, the values in the numerical column are arranged in an ascending order according to its corresponding retrieval values, the P bits are P bits associated with a first value subset preceding the value associated with the first check bit in the numerical column, and the first value subset is a subset of the first value set.

In one embodiment, the retrieval value in the retrieval column corresponding to any value in the first value subset is less than the retrieval value corresponding to the first check bit.

In one embodiment, the first sub-information-block consists of 2 bits.

In one embodiment, the first sub-information-block consists of 3 bits.

In one embodiment, the first sub-information-block consists of 4 bits.

In one embodiment, the first channel coding includes rate matching.

In one embodiment, the output of the polar code is used as an input of rate matching.

In one embodiment, the output of the first channel coding is an input after rate matching.

Embodiment 2

Figure 2:
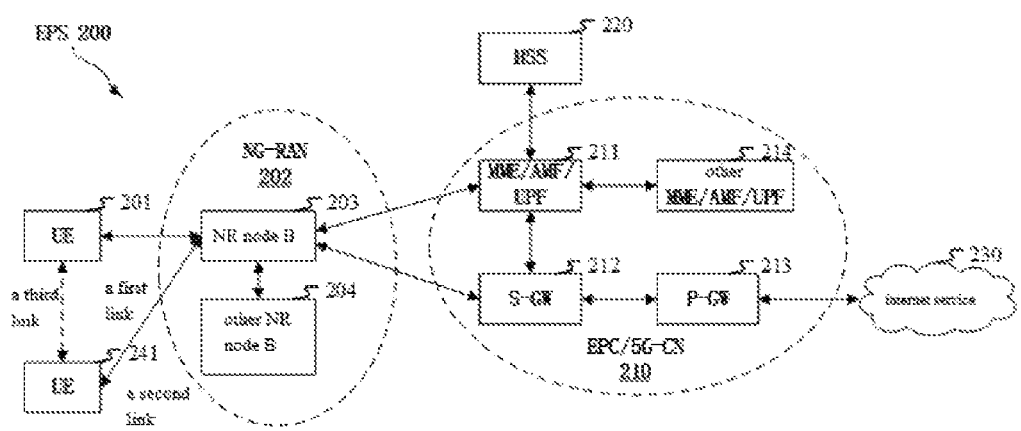
FIG. 2 is a schematic diagram illustrating a network architecture according to one embodiment of the present disclosure.

Embodiment 2 illustrates a schematic diagram of a network architecture according to the present disclosure, as shown in FIG. 2. FIG. 2 illustrates a diagram of a system network architecture 200 of NR 5G, Long-Term Evolution (LTE), and Long-Term Evolution Advanced (LTE-A). The NR 5G or LTE network architecture 200 may be referred to as an Evolved Packet System (EPS) 200 or other appropriate terms. The EPS 200 may include one or more of User Equipment (UE) 201, a Next Generation Radio Access Network (NG-RAN) 202, an Evolved Packet Core (EPC)/5G-Core Network (5G-CN) 210, a Home Subscriber Server (HSS) 220 and an Internet Service 230. The EPS may be interconnected with other access networks. For simple description, the entities/interfaces are not shown. As shown in the figure, the EPS provides packet switching services. Those skilled in the art are easy to understand that various concepts presented throughout the present disclosure can be extended to networks providing circuit switching services or other cellular networks. The NG-RAN includes an NR node B (gNB) 203 and other gNBs 204. The gNB 203 provides UE 201 oriented user plane and control plane protocol terminations. The gNB 203 may be connected to other gNBs 204 via an Xn interface (for example, backhaul). The gNB 203 may be called a base station, a base transceiver station, a radio base station, a radio transceiver, a transceiver function, a Basic Service Set (BSS), an Extended Service Set (ESS), a Transmitter Receiver Point (TRP) or other appropriate terms. The gNB 203 provides an access point of the EPC/5G-CN 210 for the UE 201. Examples of UE 201 include cellular phones, smart phones, Session Initiation Protocol (SIP) phones, laptop computers, Personal Digital Assistants (PDAs), Satellite Radios, Global Positioning Systems (GPSs), multimedia devices, video devices, digital audio player (for example, MP3 players), cameras, games consoles, unmanned aerial vehicles, air vehicles, narrowband physical network equipment, machine-type communication equipment, land vehicles, automobiles, wearable equipment, or any other devices having similar functions. Those skilled in the art also can call the UE 201 a mobile station, a subscriber station, a mobile unit, a subscriber unit, a wireless unit, a remote unit, a mobile device, a wireless device, a radio communication device, a remote device, a mobile subscriber station, an access terminal, a mobile terminal, a wireless terminal, a remote terminal, a handset, a user proxy, a mobile client, a client or other appropriate terms. The gNB 203 is connected to the EPC/5G-CN 210 via an S1/NG interface. The EPC/5G-CN 210 includes an MME/AMF/UPF 211, other MME/AMF/UPFs 214, a Service Gateway (S-GW) 212 and a Packet Data Network Gateway (P-GW) 213. The MME/AMF/UPF 211 is a control node for processing a signaling between the UE 201 and the EPC/5G-CN 210. Generally, the MME/AMF/UPF 211 provides bearer and connection management. All user Internet Protocol (IP) packets are transmitted through the S-GW 212. The S-GW 212 is connected to the P-GW 213. The P-GW 213 provides UE IP address allocation and other functions. The P-GW 213 is connected to the Internet service 230. The Internet service 230 includes IP services corresponding to operators, specifically including Internet, Intranet, IP Multimedia Subsystems (IP IMSs) and Packet Switching Streaming Services (PSSs).

In one embodiment, the UE 201 corresponds to the UE in the present disclosure.

In one embodiment, the gNB 203 corresponds to the base station in the present disclosure.

In one embodiment, the UE 201 supports polar code decoding.

In one embodiment, the gNB 203 supports polar code coding.

Embodiment 3

Figure 3:
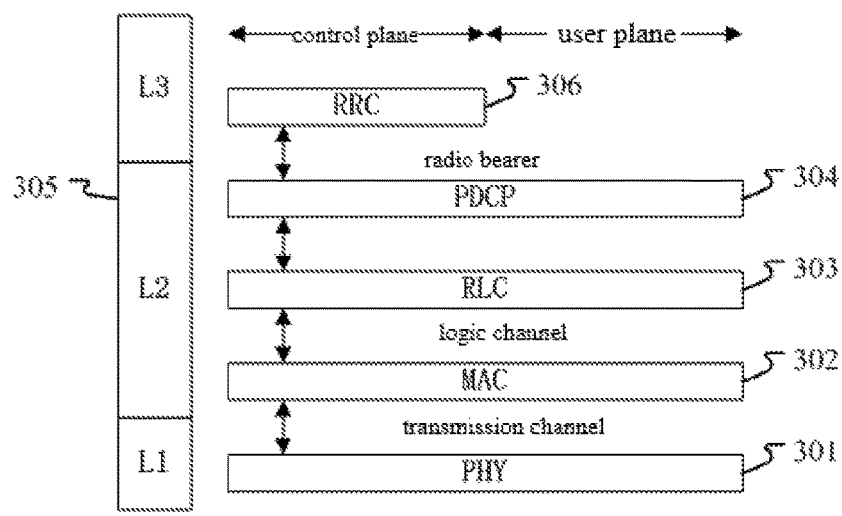
FIG. 3 is a schematic diagram illustrating a radio protocol architecture of a user plane and a control plane according to one embodiment of the present disclosure.

Embodiment 3 illustrates a schematic diagram of a radio protocol architecture of a user plane and a control plane according to the present disclosure, as shown in FIG. 3. FIG. 3 illustrates a schematic diagram of a radio protocol architecture of a user plane and a control plane. In FIG. 3, the radio protocol architecture of user equipment (UE) and Base Station Equipment (gNB or eNB) is represented by three layers, which are a layer 1, a layer 2 and a layer 3 respectively. The layer 1 (L1) 301 is the lowest layer and performs signal processing functions of each PHY layer. The layer 1 is called PHY 301 in this paper. The layer 2 (L2) 305 is above the PHY 301, and is in charge of the link between the UE and the gNB via the PHY 301. In the user plane, the L2 305 includes a Medium Access Control (MAC) sublayer 302, a Radio Link Control (RLC) sublayer 303, and a Packet Data Convergence Protocol (PDCP) sublayer 304. All the three sublayers terminate at the gNB of the network side. Although not described in FIG. 3, the UE may include several higher layers above the L2 305, such as a network layer (i.e. IP layer) terminated at a P-GW of the network side and an application layer terminated at the other side of the connection (i.e. a peer UE, a server, etc.). The PDCP sublayer 304 provides multiplexing among variable radio bearers and logical channels. The PDCP sublayer 304 also provides a header compression for a higher-layer packet so as to reduce a radio transmission overhead. The PDCP sublayer 304 provides security by encrypting a packet and provides support for UE handover between gNBs. The RLC sublayer 303 provides segmentation and reassembling of a higher-layer packet, retransmission of a lost packet, and reordering of a lost packet to as to compensate the disordered receiving caused by Hybrid Automatic Repeat Request (HARQ). The MAC sublayer 302 provides multiplexing between logical channels and transport channels. The MAC sublayer 302 is also responsible for allocating between UEs various radio resources (i.e., resource block) in a cell. The MAC sublayer 302 is also in charge of HARQ operation. In the control plane, the radio protocol architecture of the UE and the gNB is almost the same as the radio protocol architecture in the user plane on the PHY 301 and the L2 305, but there is no header compression function for the control plane. The control plane also includes a Radio Resource Control (RRC) sublayer 306 in the layer 3 (L3). The RRC sublayer 306 is responsible for acquiring radio resources (i.e. radio bearer) and configuring the lower layers using an RRC signaling between the gNB and the UE.

In one embodiment, the radio protocol architecture in FIG. 3 is applicable to the UE in the present disclosure.

In one embodiment, the radio protocol architecture in FIG. 3 is applicable to the base station equipment in the present disclosure.

In one embodiment, the first radio signal in the present disclosure is generated by the PHY 301.

In one embodiment, the first information in the present disclosure is generated by the PHY 301.

Embodiment 4

Figure 4:
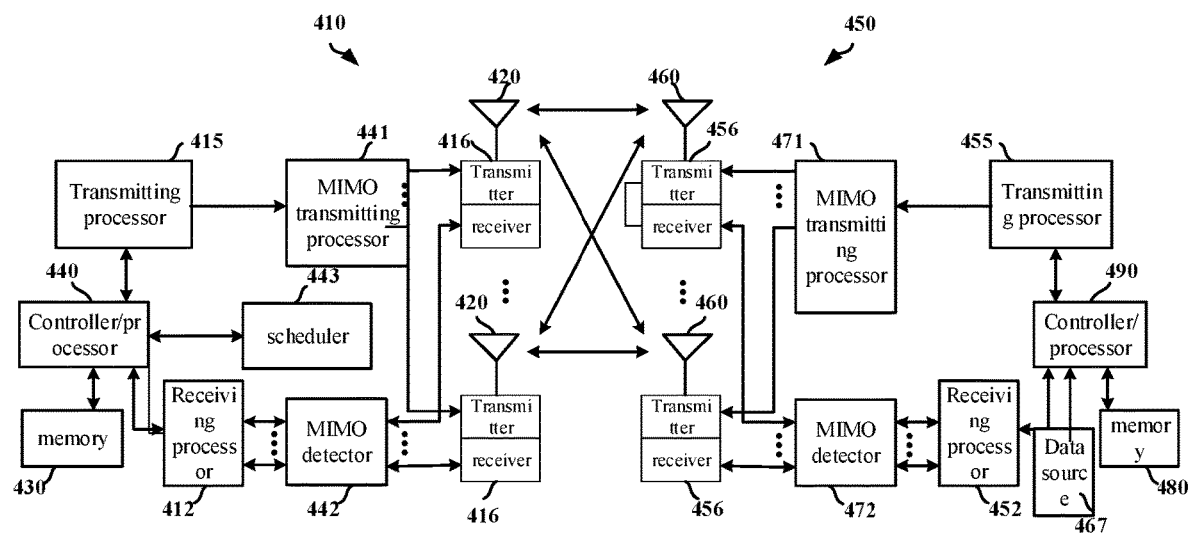
FIG. 4 is a schematic diagram illustrating an evolved node and a given user equipment according to one embodiment of the present disclosure.

Embodiment 4 shows a schematic diagram of base station equipment and given user equipment according to the present disclosure, as shown in FIG. 4. FIG. 4 is a block diagram of a gNB 410 in communication with UE 450 in an access network.

The base station equipment (410) may include a controller/processor 440, a scheduler 443, a memory 430, a receiving processor 412, a transmitting processor 415, a MIMO transmitting processor 441, a MIMO detector 442, a transmitter/receiver 416 and an antenna 420.

The user equipment (UE 450) may include a controller/processor 490, a memory 480, a data source 467, a transmitting processor 455, a receiving processor 452, a MIMO transmitting processor 471, a MIMO detector 472, a transmitter/receiver 456, and an antenna 460.

In the downlink transmission, the processing related to the base station equipment (410) may include the following steps:

the upper-layer packet arrives at the controller/processor 440, which provides packet header compression, encryption, packet segmentation and reordering, and multiplexing and demultiplexing between the logical and transport channels for implementing the L2 layer protocol for the user plane and the control plane; the upper-layer packet may include data or control information, such as a Downlink Shared Channel (DL-SCH);

the controller/processor 440 may be associated with a memory 430 that stores program codes and data, the memory 430 may be a computer-readable medium;

the controller/processor 440 notifies the scheduler 443 of the transmission request, and the scheduler 443 is configured to schedule the air interface resource corresponding to the transmission requirement and notify the controller/processor 440 of the scheduling result;

the controller/processor 440 transmits the control information for the downlink transmission obtained in such a way that the receiving processor 412 processes the uplink receiving to the transmitting processor 415;

the transmitting processor 415 receives the output bit stream of controller/processor 440, and implements various signal transmission processing functions for the L1 layer (i.e., the physical layer) including coding, interleaving, scrambling, modulating, power control/allocation, and generates physics layer control signaling (including a PBCH, a PDCCH, a PHICH, a PCFICH, a reference signal), etc.;

the MIMO transmitting processor 441 performs spatial processing of data symbols, control symbols or reference signal symbols (such as multi-antenna precoding, digital beamforming), and outputs baseband signals to the transmitter 416;

the MIMO transmitting processor 441 outputs an analog transmitting beamforming vector to the transmitter 416;

the transmitter 416 is configured to convert the baseband signals provided by the MIMO transmitting processor 441 into radio frequency signals and transmit the signals via the antenna 420; each transmitter 416 samples the respective input symbol streams to obtain respective sampled signal streams; each transmitter 416 performs further processing (such as digital to analog conversion, amplification, filtering, upconversion, etc.) on the respective sampling streams to obtain downlink signals; the analog transmitting beamforming is processed in the transmitter 416.

In the downlink transmission, the processing related to the user equipment (UE 450) may include the following steps:

the receiver 456 is configured to convert radio frequency signals received through the antenna 460 into baseband signals and provide the signals to the MIMO detector 472; the analog receiving beamforming is processed in the receiver 456;

the MIMO detector 472 is configured to perform MIMO detection on the signal received from the receiver 456 and provide baseband signals that have been subjected to MIMO detection to the receiving processor 452;

the receiving processor 452 is configured to extract parameters related to the analog receiving beamforming and output the parameters to the MIMO detector 472, and the MIMO detector 472 outputs the analog receiving beamforming vector to the receiver 456;

the receiving processor 452 implements various signal transmission processing functions for the L1 layer (i.e., the physical layer) including decoding, deinterleaving, descrambling, demodulating, and physical layer control signaling extraction, etc.

the controller/processor 490 receives the bit stream output by the receiving processor 452, and provides packet header decompression, decryption, packet segmentation and reordering, and multiplexing and demultiplexing between the logical and transport channels for implementation the L2 layer protocol for the user plane and the control plane;

the controller/processor 490 may be associated with a memory 480 that stores program codes and data, the memory 480 may be a computer-readable medium;

the controller/processor 490 transmits the control information for the downlink receiving obtained in such a way that the transmitting processor 455 processes the uplink transmission to the receiving processor 452.

The first sub-information block, the first information block, the first bit block and the first radio signal in the present disclosure are sequentially generated by the transmitting processor 415. The MIMO transmitting processor 441 performs multi-antenna precoding on the baseband signal related to the first radio signal output by the transmitting processor 415. The transmitter 416 converts the baseband signal provided by the MIMO transmitting processor 441 into a radio frequency signal, performs analog transmitting beamforming, and transmits the signal via the antenna 420. The receiver 456 will receive the signal through the antenna 460, perform analog receiving beamforming, obtain a radio frequency signal related to the first radio signal, convert the signal into a baseband signal and provide the baseband signal to the MIMO detector 472. The MIMO detector 472 performs MIMO detection on the signal received from the receiver 456. The receiving processor 452 processes the baseband signal output by the MIMO detector 472 to sequentially obtain the first radio signal, the first sub-information block, the first bit block and the first information block.

In the uplink transmission, the processing related to the user equipment (UE 450) may include the following steps:

The data source 467 provides an upper-layer packet to controller/processor 490, which provides packet header compression, encryption, packet segmentation and reordering, and multiplexing and demultiplexing between the logical and transport channels for implementing the L2 layer protocol for the user plane and the control plane; the upper-layer packet may include data or control information, such as a Uplink Shared Channel (UL-SCH);

the controller/processor 490 may be associated with a memory 480 that stores program codes and data, the memory 480 may be a computer-readable medium;

the controller/processor 490 transmits the control information for the uplink transmission obtained in such a way that the receiving processor 452 processes the downlink receiving to the transmitting processor 455;

the transmitting processor 455 receives the output bit stream of controller/processor 490, and implements various signal transmission processing functions for the L1 layer (i.e., the physical layer) including coding, interleaving, scrambling, modulating, power control/allocation, and generates physics layer control signaling (including a PBCH, a PDCCH, a PHICH, a PCFICH, a reference signal), etc.;

the MIMO transmitting processor 471 performs spatial processing of data symbols, control symbols or reference signal symbols (such as multi-antenna precoding, digital beamforming), and outputs baseband signals to the transmitter 456;

the MIMO transmitting processor 471 outputs an analog transmitting beamforming vector to the transmitter 456;

the transmitter 456 is configured to convert the baseband signals provided by the MIMO transmitting processor 471 into radio frequency signals and transmit the signals via the antenna 460; each transmitter 456 samples the respective input symbol streams to obtain respective sampled signal streams; each transmitter 456 performs further processing (such as digital to analog conversion, amplification, filtering, upconversion, etc.) on the respective sampling streams to obtain uplink signals; the analog transmitting beamforming is processed in the transmitter 456.

In the uplink transmission, the processing related to the base station equipment (410) may include the following steps:

the receiver 456 is configured to convert radio frequency signals received through the antenna 420 into baseband signals and provide the signals to the MIMO detector 442; the analog receiving beamforming is processed in the receiver 416;

the MIMO detector 442 is configured to perform MIMO detection on the signal received from the receiver 416 and provide baseband signals that have been subjected to MIMO detection to the receiving processor 442;

the MIMO detector 442 outputs an analog receiving beamforming vector to the receiver 416;

the receiving processor 412 implements various signal transmission processing functions for the L1 layer (i.e., the physical layer) including decoding, deinterleaving, descrambling, demodulating, and physical layer control signaling extraction, etc.

the controller/processor 440 receives the bit stream output by the receiving processor 412, provides packet header decompression, decryption, packet segmentation and reordering, and multiplexing and demultiplexing between the logical and transport channels for implementation the L2 layer protocol for the user plane and the control plane;

the controller/processor 440 may be associated with a memory 430 that stores program codes and data, the memory 430 may be a computer-readable medium;

the controller/processor 440 transmits the control information for the uplink transmission obtained in such a way that the transmitting processor 415 processes the downlink receiving to the receiving processor 412.

In one embodiment, the gNB 410 device includes: at least one processor and at least one memory, wherein the at least one memory includes a computer program code; the at least one memory and the computer program code are configured to be used together with the at least one processor. The gNB 410 device at least: generates a first information block, wherein the first information block includes K bits consisting of bits in M sub-information-blocks and Q padding bits, where M is a positive integer greater than one, Q is a non-negative integer, and K is a positive integer greater than one; performs first channel coding, wherein a first bit block is used for an input of the first channel coding, the first channel coding is based on a polar code, the first bit block includes the K bits and L check bits, and the first information block is used to generate the L check bits, where L is a positive integer; and transmits a first radio signal, wherein the output of the first channel coding is used to generate a first radio signal; wherein any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block. In one embodiment, the value of the first sub-information-block is a retrieval of an information format of the first information block in K1 candidate formats, where K1 is a positive integer greater than one.

In one embodiment, the gNB 410 includes: a memory in which a computer-readable instruction program is stored, wherein the computer-readable instruction program generates an action when executed by at least one processor, the action includes: generating a first information block, wherein the first information block includes K bits consisting of bits in M sub-information-blocks and Q padding bits, where M is a positive integer greater than one, Q is a non-negative integer, and K is a positive integer greater than one; performing first channel coding, wherein a first bit block is used for an input of the first channel coding, the first channel coding is based on a polar code, the first bit block includes the K bits and L check bits, and the first information block is used to generate the L check bits, where L is a positive integer; and transmitting a first radio signal, wherein the output of the first channel coding is used to generate a first radio signal; wherein any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block. or the value of the first sub-information-block is related to Q; the first information block and the L check hits are sequentially mapped into the first hit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the UE 450 device includes: at least one processor and at least one memory, wherein the at least one memory includes a computer program code; the at least one memory and the computer program code are configured to be used together with the at least one processor. The UE 450 device includes: receiving a first radio signal, wherein the first radio signal is used for an input of first channel decoding; performing first channel decoding, wherein the first channel decoding corresponds to first channel coding, the first channel coding is based on a polar code, and a first bit block is used for an input of the first channel coding; recovering a first information block, wherein the first information block includes K bits consisting of bits in M sub-information-blocks and Q padding bits, the first bit block includes the K bits and L check bits, the first information block is used to generate the L check bits, where M and K are both positive integers greater than 1, Q is a non-negative integer, and L is a positive integer; wherein any one of the M sub-information-blocks consists of a positive integer number of bits, the first sub-information-block is a sub-information-block of the M sub-information-blocks, the first sub-information-block consists of P bits, where P is a positive integer; the value of the first sub-information-block is related to the information format of the first information block, or the value of the first sub-information-block is related to Q; the first information block and the L check bits are sequentially mapped to the first bit block after being interleaved, the positions of the P bits in the first bit block are all prior to the first check bit, the first check bit is the front-most check bit of the L check bits in the first bit block, and both the previous adjacent bit and the next adjacent bit of the first check bit in the first bit block are bits in the first information block.

In one embodiment, the UE 450 includes: a memory in which a computer-readable instruction program is stored, wherein the computer-readable instruction program generates an action when executed by at least one processor, the action includes: receiving a first radio signal, wherein the first radio signal is used for an input of first channel decoding; performing first channel decoding, wherein the first channel decoding corresponds to first channel coding, the first channel coding is based on a polar code, and a first hit block is used for an input of the first channel coding; recovering a first information block, wherein the first information block includes K bits consisting of bits in M sub-information-blocks and Q padding bits, the first bit block includes the K bits and L check bits, the first information block is used to generate the L check bits, where M and K are both positive integers greater than 1, Q is a non-negative integer, and L is a positive integer; wherein any one of the M sub-information-blocks consists of a positive integer number of bits, the first sub-information-block is a sub-information-block of the M sub-information-blocks, the first sub-information-block consists of P bits, where P is a positive integer; the value of the first sub-information-block is related to the information format of the first information block. or the value of the first sub-information-block is related to Q; the first information block and the L check bits are sequentially mapped to the first bit block after being interleaved, the positions of the P bits in the first bit block are all prior to the first check bit, the first check bit is the front-most check bit of the L check bits in the first bit block, and both the previous adjacent bit and the next adjacent bit of the first check bit in the first bit block arc bits in the first information block.

In one embodiment, the gNB 410 corresponds to the base station in the present disclosure.

In one embodiment, the UE 450 corresponds to the user equipment in the present disclosure.

In one embodiment, the gNB 410 corresponds to the base station in the present disclosure.

In one embodiment, the UE 450 corresponds to the user equipment in the present disclosure.

In one embodiment, a transmitting processor 415, a MIMO transmitter 441, and a transmitter 416 are used to transmit the first radio signal in the present disclosure.

In one embodiment, a receiver 456, a MIMO detector 472, and a receiving processor 452 are used to receive the first radio signal in the present disclosure.

In one embodiment, the transmitting processor 415 is used to generate a first information block.

In one embodiment, the receiving processor 452 is used to recover the first information block.

In one embodiment, the transmitting processor 415 is used to perform the first channel coding.

In one embodiment, the receiving processor 452 is configured to perform first channel decoding.

Embodiment 5

Figure 5:
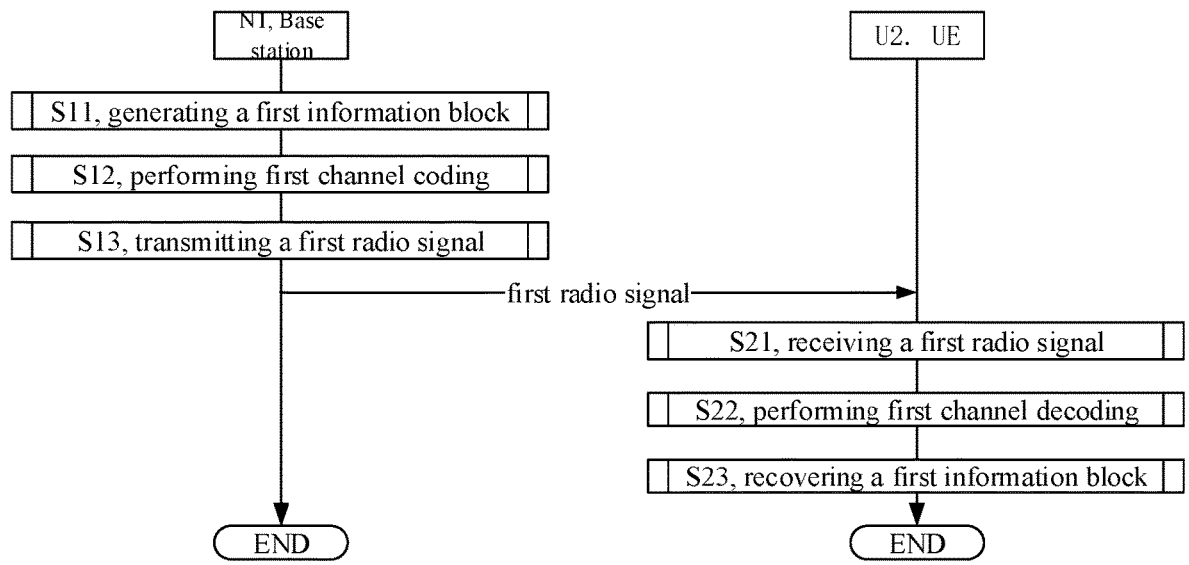
FIG. 5 is a flow chart illustrating transmission of a radio signal according to one embodiment of the present disclosure.

Embodiment 5 is a flow chart illustrating a radio signal transmission according to the present disclosure, as shown in FIG. 5. In FIG. 5, the base station N1 is a maintenance base station of the serving cell of the UE U2.

The base station N1 generates a first information block in step S11, performs first channel coding in step S12, and transmits a first radio signal in step S13.

The UE U2 receives the first radio signal in step S21, performs first channel decoding in step S22, and recovers the first information block in step S23.

In Embodiment 5, the first information block includes K bits consisting of bits in M sub-information-blocks and Q padding bits, where M is a positive integer greater than one, Q is a non-negative integer, and K is a positive integer greater than one; a first hit block is used by N1 for an input of the first channel coding, the first channel coding corresponds to the first channel coding, the first channel coding is based on a polar code, the first bit block includes the K bits and L check bits, and the first information block is used by N1 to generate the L check bits, where L is a positive integer; the output of the first channel coding is used by N1 to generate a first radio signal; any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one sub-embodiment, N1 determines the position of the P bits in the first information block, U2 obtains the P bits by decoding, and the position of the P bits in the first information block ensures that the positions of the P bits in the first bit block are prior to the first check bit.

In one sub-embodiment, the positions of the P bits in the first bit block are continuous, and the positions of the P bits in the first information block are also continuous.

In one sub-embodiment, the P bits are P bits whose position is front-most in the first bit block among the bits constituting the first information block.

In one sub-embodiment, the P bits are the P bits that are positioned last in the first information block.

In one sub-embodiment, the position of the P bits in the first information block is related to the number of bits in the first information block.

In one sub-embodiment, the relative positions between the P bits and the first check bit in the first bit block is unrelated to the number of bits in the first information block.

In one sub-embodiment, the relative positions between the P bits and the first check bit in the first bit block is related to the number of bits in the first information block.

In one sub-embodiment, the positions of the Q padding bits in the first information block are discontinuous.

The above sub-embodiments may be arbitrarily combined without conflict.

Embodiment 6

Figure 6:
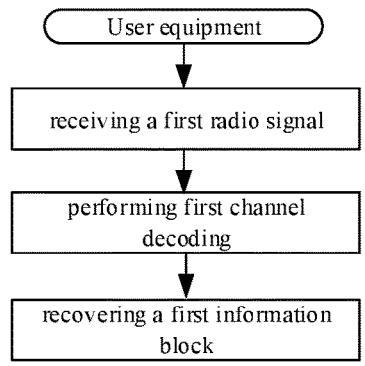
FIG. 6 is a flow chart illustrating a first radio signal, first channel decoding and a first information block according to an embodiment of the present disclosure.

Embodiment 6 is a flow chart illustrating a first radio signal, first channel decoding and a first information block according to an embodiment of the present disclosure. In FIG. 6, each block represents a step.

In Embodiment 6, the user equipment in the present disclosure sequentially receives the first radio signal, performs first channel decoding, and recovers the first information block; the first radio signal is used for an input of first channel decoding; the first channel decoding corresponds to first channel coding, the first channel coding is based on a polar code, and a first bit block is used for an input of the first channel coding; and the first information block includes K bits consisting of bits in M sub-information-blocks and Q padding bits, the first bit block includes the K bits and L check bits, and the first information block is used to generate the L check bits, where M and K are both positive integers greater than 1, Q is a non-negative integer, and L is a positive integer; any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block. or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent hit and the next adjacent bit of the first check hit in the first hit block are bits in the first information block.

In one embodiment, the polar code refers to using the result of multiplying a fifth bit block of length N by a Kronecker Matrix having N rows and N columns as an output of a polar code, and the fifth bit block includes the K bits, and the L check bits and frozen bits.

In one embodiment, the first bit block does not include frozen bits, and a frozen bit block and the first bit block are sequentially cascaded to generate a fourth bit block.

In one embodiment, the bits in the fourth bit block are arranged in an ascending order according to reliability coefficients.

The positions of the bits in the fourth bit block are in one-to-one correspondence with the N reliability coefficients, respectively, the N reliability coefficients are in one-to-one correspondence with the sequence number of the N subchannels, respectively, the bits in the fourth bit block are placed on the subchannels corresponding to their position, and the bits on the N subchannels are arranged in an ascending order according to the sequence number of the N subchannels to form a fifth bit block.

In one embodiment, the fifth bit block is used as an input of the polar code.

In one embodiment, the first information block is a DCI block.

In one embodiment, a PDCCH is used to transmit the first information block.

In one embodiment, the first sub-information-block indicates the information format of the first information block, and an information format of the first information block is used to determine Q.

In one embodiment, the sequential order in which the bits in the first information block are in the first information block is different from the sequential order in which the bits in the first information block are in the first bit block.

In one embodiment, the first information block and the L check bits are sequentially cascaded to generate a third bit block, and the first interleaving table is used to interleave the third bit block to generate the first bit block.

In one embodiment, the first interleaving table includes a retrieval column and a numerical column, the retrieval column includes continuous retrieval values that are in one-to-one correspondence with values in the numerical column, the retrieval values are used to sequentially generate bits in the first bit block, the values in the first value set in the numerical column are in one-to-one association with bit positions in the third bit block, the values in the numerical column are arranged in an ascending order according to its corresponding retrieval values, the P bits are P bits associated with a first value subset preceding the value associated with the first check bit in the numerical column, and the first value subset is a subset of the first value set.

In one embodiment, the retrieval value in the retrieval column corresponding to any value in the first value subset is less than the retrieval value corresponding to the first check bit.

In one embodiment, the first sub-information-block consists of 2 bits.

In one embodiment, the first sub-information-block consists of 3 bits.

In one embodiment, the first sub-information-block consists of 4 bits.

In one embodiment, the first channel coding includes rate matching.

In one embodiment, the output of the polar code is used as an input of rate matching.

In one embodiment, the output of the first channel coding is an input after rate matching.

Embodiment 7

Figure 7:
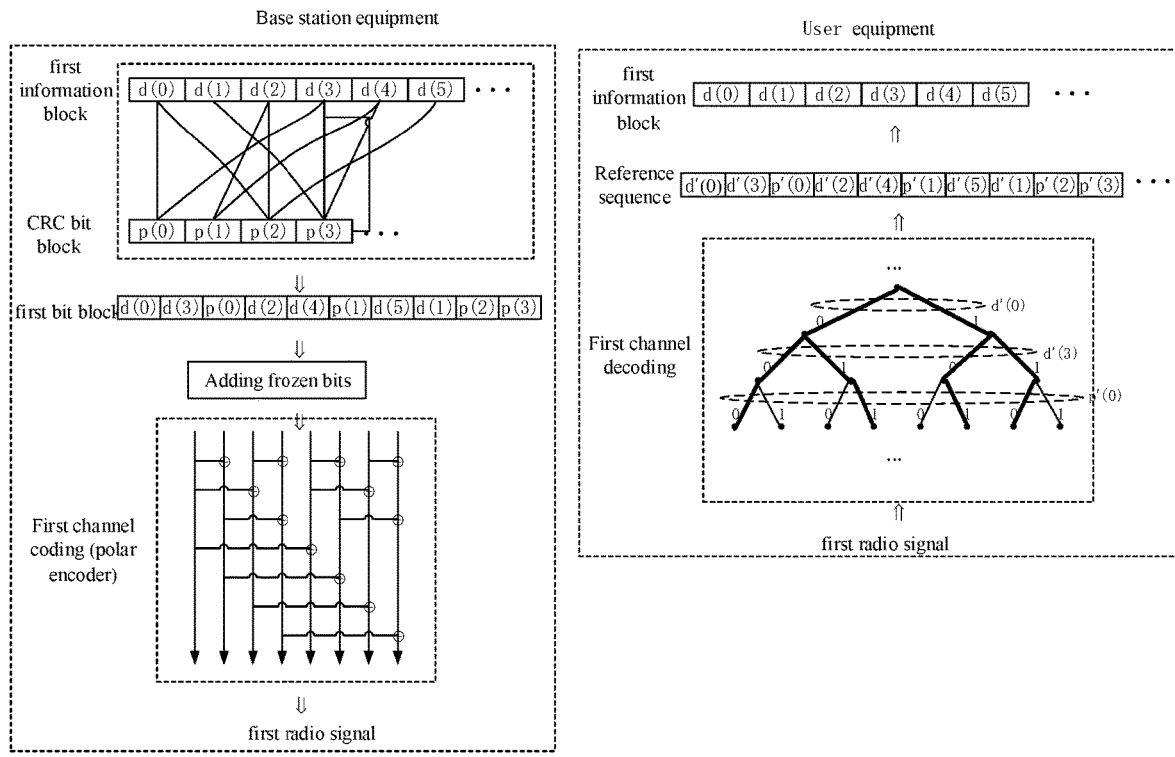
FIG. 7 is a schematic diagram illustrating first channel coding and first channel decoding according to an embodiment of the present disclosure.

Embodiment 7 illustrates the first channel coding and the first channel decoding, as shown in FIG. 7.

In Embodiment 7, in the base station equipment, the bits $d(1)\ d(2)\ d(3)\ d(4)\ d(5)\ldots$ in the first information block are used to generate bits in the CRC bit blocks $p(1)\ p(2)\ d(3)\ldots$, the CRC bit block sequentially consists of L check bits, the bits in the first information block and the CRC bit block are interleaved to obtain a first bit block, the first bit block is used as an input of first channel coding after adding frozen bits, the output of the channel coding is used to generate the first radio signal, and the channel coding is based on a polar code. At least a portion of the bits in the L check bits are distributed (i.e., discontinuous) in the first bit block.

In the user equipment, the received first radio signal is used to generate an input of the first channel decoding, and the first channel decoding is based on the first channel coding. The output of the first channel decoding is a reference sequence, and the reference sequence and the bits in the first bit block are in one-to-one correspondence.

In FIG. 7, the bits in the first information block are represented by d(i), where i is an integer greater than or equal to 0; the bits in the CRC bit block are represented by p(j), where j is an integer greater than or equal to 0. The bits in the first information block and the associated bits in the CRC bit block are connected by a solid line. The tree diagram in the decoder represents a portion of the path associated with the bits {d(0), d(3), p(0)} in the channel decoding, and the position of the bits {d(0), d(3), p(0)} in the first bit block is continuous.

In one embodiment, the first channel decoding is based on Viterbi criteria, and the reference value corresponding to at least one CRC bit is used for pruning in the first channel decoding.

In one embodiment, the CRC bit block includes 24 bits, in which 8 bits are discontinuous.

In one embodiment, the first information block includes bits in the first sub-information block, the first bit block includes Q padding bits, where Q is a positive integer; in the first channel decoding, the user equipment determines an element corresponding to bits in the first sub-information-block in the reference sequence first before obtaining an element corresponding to Q1 padding bits in the reference sequence, determines a value of the Q1 padding bits according to the element corresponding to bits in the first sub-information-block in the reference sequence, and performs a subsequent decoding operation using the Q1 padding bits as frozen bits, where the Q1 padding bits are a subset of the Q padding bits.

In one embodiment, Q1 is equal to Q.

In one embodiment, Q1 is less than Q, and the padding bits in the Q padding bits other than the Q1 padding bits are decoded prior to the first sub-information block.

In one embodiment, the value of each element in the reference sequence is a Log Likelihood Ratio (LLR) estimated for the corresponding (transmitted) bits.

In one embodiment, an element corresponding to the Q1 padding bits in the reference sequence is 0; the value of each element in the reference sequence is a Log Likelihood Ratio (LLR) estimated for the corresponding (transmitted) bits, except the element corresponding to the Q1 padding bits.

In one embodiment, the first radio signal is an output subsequently to being subjected to scrambling, a modulation mapper, a layer mapper, precoding, a resource element mapper, and wideband symbol generation sequentially after the first bit block is added with frozen bits.

In one embodiment, the first radio signal is an output subsequently to being subjected to scrambling, a modulation mapper, a layer mapper, a transform precoder (which is configured to generate a complex value signal), precoding, a resource element mapper, and wideband symbol generation sequentially after the first bit block is added with frozen bits.

In one embodiment, the CRC bit block is an output of the first information block subjected to a CRC cyclic generator polynomial.

In one embodiment, the CRC bit block is an output after the first information block is subjected to a CRC cyclic generator polynomial and scrambling.

In one embodiment, the polynomial formed by the first information block and the CRC bit block prior to scrambling can be divisible by the CRC cyclic generator polynomial on the GF(2), that is, the remainder obtained by dividing the polynomial formed by the first information block and the CRC bit block prior to scrambling by the CRC cyclic generator polynomial is zero.

In one embodiment, the first channel coding includes rate matching.

In one embodiment, the pruning is used to reduce surviving search paths in the channel decoding based on Viterbi criteria. For example, in the tree diagram of FIG. 7, the paths indicated by thick solid lines are the surviving search paths, and the other paths are the search paths that are deleted.

In one embodiment, in the first bit block, bits in the first information block corresponding to the pruned search path are prior to the associated CRC bits.

Embodiment 8

Figure 8:
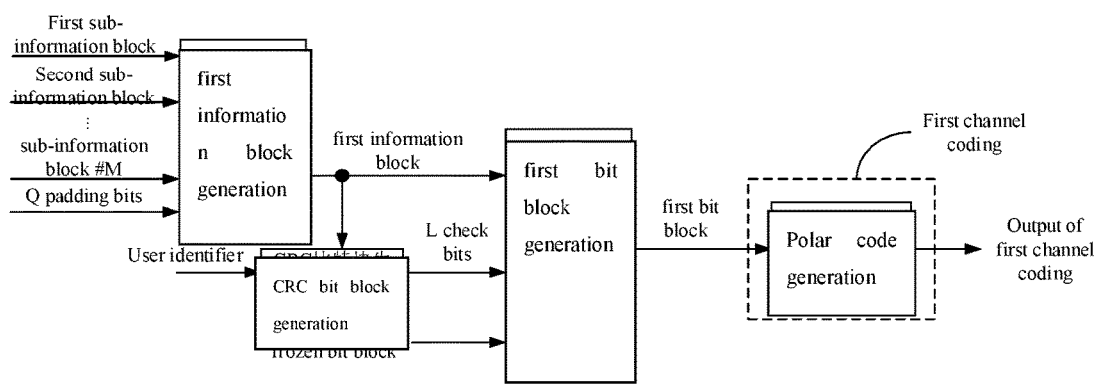
FIG. 8 is a schematic diagram illustrating first channel coding according to an embodiment of the present disclosure.

Embodiment 8 illustrates the first channel coding, as shown in FIG. 8.

In Embodiment 8, the first channel coding includes a polar code generating module, the first bit block is used as an input of the polar code generating module, and an output of the polar code generating module is the output of the first channel coding. The first information block generating module, the CRC bit generating module, and the first bit block generating module are processing modules prior to the first channel coding. The CRC bit generating module is used to generate the first bit block.

In Embodiment 8, the first information block includes bits in M sub-information-blocks and Q padding bits, and the M sub-information-blocks are sub-information-block #1, sub-information-block #2, . . . sub-information-block # M in FIG. 8, respectively. The first sub-information-block is one of the M sub-information-blocks. The value of the first sub-information-block is related to Q. The first information block is used to generate a CRC bit block. The identifier corresponding to the user equipment is used to scramble the CRC bit block to generate the L check bits. The first information block, the L check bits and the frozen bit block are used to generate the first bit block. The frozen bit block includes a positive integer number of frozen bits. The first sub-information-block consists of P bits, where the P is a positive integer. The first information block and the L check bits are sequentially mapped into the first bit block after being interleaved. The positions of the P bits in the first bit block are all prior to the first check bit, the first check bit is a check bit whose position is front-most among the L check bits in the first bit block, and both the previous adjacent bit and the next adjacent bit of the first check hit in the first hit block are hits in the first information block.

In one embodiment, all frozen bits in the frozen bit block are zero.

In one embodiment, all bits in the frozen bit block are continuous in the first bit block.

In one embodiment, the bits generated after the first information block and the L check bits are interleaved referring to Table 5.3.1-1 of The 3rd Generation Partnership Project (3GPP) standard TS38.212 are sequentially mapped into the first bit block.

In one embodiment, the first information block is generated by sequentially cascading sub-information-block #1, sub-information-block #2, . . . sub-information-block # M and Q padding bits, where Q is greater than zero.

In one embodiment, Q is equal to 0, and the first information block is generated by sequentially cascading sub-information-block #1, sub-information-block #2, . . . sub-information-block # M.

In one embodiment, the sequential order in which the bits in the first information block are in the first information block is different from the sequential order in which the bits in the first information block are in the first bit block.

In one embodiment, the frozen bit and the padding bit are both zero.

In one embodiment, the length of the first bit block is the Nth power of 2, where the N is a positive integer.

In one embodiment, the polar code generating module multiplies the input bit block and the polar code generation matrix, and uses the multiplication result as an output.

In one embodiment, the polar code generation matrix is a Kronecker matrix.

Embodiment 9

Figure 9:
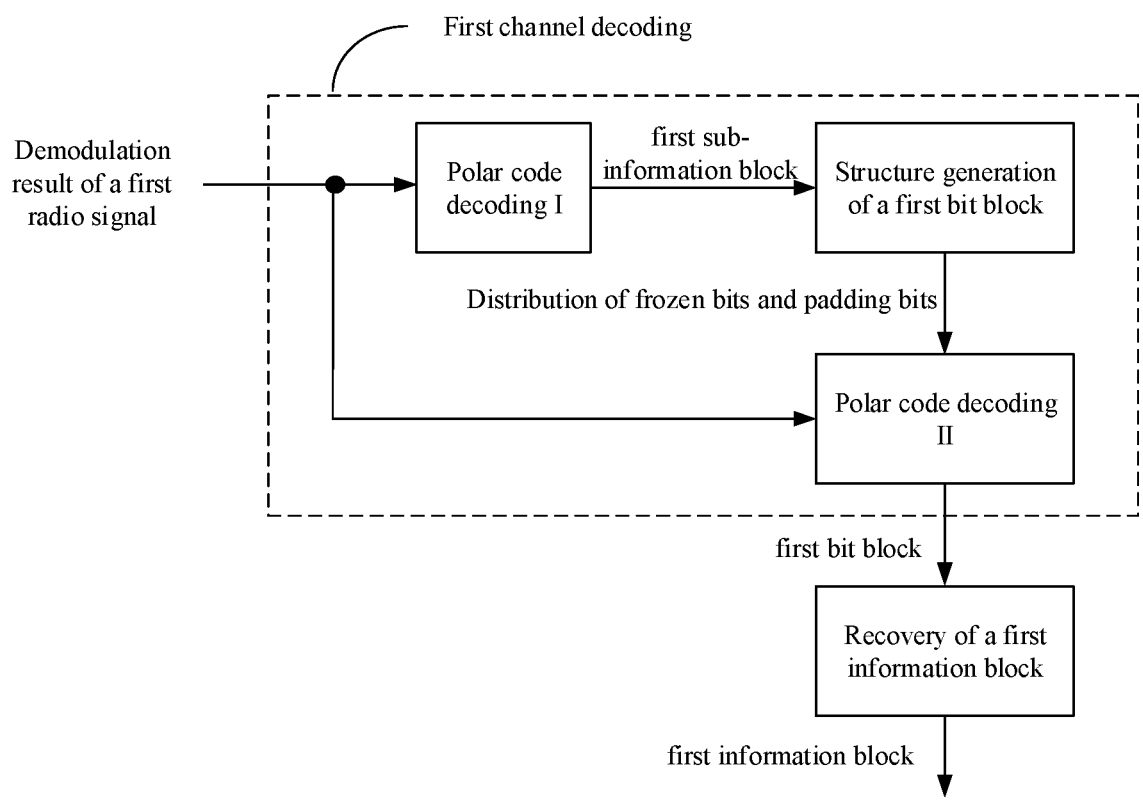
FIG. 9 is a schematic diagram illustrating first channel decoding according to one embodiment of the present disclosure.

Embodiment 9 illustrates the first channel decoding, as shown in FIG. 9.

In Embodiment 9, the first channel decoding includes a polar code decoding I module, a structure generating module of the first bit block, and a polar code decoding II module. The output of the first channel decoding is the first bit block. The first bit block is used by the first block recovering module to generate the first information block.

In Embodiment 9, the first bit block is used by a transmitter to generate a first radio signal. The first bit block includes a bit in a first information block, L check bits corresponding to the first information block, and a frozen bit. The order in which the bits in the first information block are in the first information block is different from the order in which the bits in the first information block are in the first bit block. The first information block includes bits in M sub-information-blocks and Q padding bits, where M is a positive integer greater than 1, and Q is an integer not less than 0. The first sub-information-block is a sub-information-block of the M sub-information-blocks, the value of the first sub-information-block indicates an information format of the first information block, and the information format of the first information block is used to determine Q. The first sub-information-block consists of P bits, where P is a positive integer.

In Embodiment 9, the demodulation result of the first radio signal is used for an input of the polar code decoding I module, and the polar code decoding I module is correspondingly used by the transmitter for the polar code generating module of the first bit block. The output of the polar code decoding I module is used to determine the first sub-information block. The value of the first sub-information-block is used to determine an input of a structure generating module used for the first bit block. The positions of the P bits in the first bit block arc prior to the first check bit, and the first check bit is a check bit whose position is front-most among the L check hits in the first hit block. The first check hit is also used to determine whether the decoding of the first sub-information-block is correct. In the structure generating module of the first bit block, the value of the first sub-information-block is used to determine Q. thereby being used to determine the structure of the first bit block, i.e., the position where the frozen bit and the padding bit are located. An output of the structure generating module of the first bit block is used to determine a distribution of the frozen bit and the padding bit, i.e., the structure of the first bit block. The structure of the first bit block and the demodulation result of the first radio signal are used for an input of the polar code decoding II module. The polar code decoding II module corresponds to a polar code generating module used by the transmitter for the first bit block. The frozen bit, the padding bit, and the bit in the first sub-information-block are used as a known bit in the polar code decoding II module. The first information block recovering module extracts and reorders bits corresponding to the first information block from the first bit block to generate the first information block.

Embodiment 10

Figure 10:
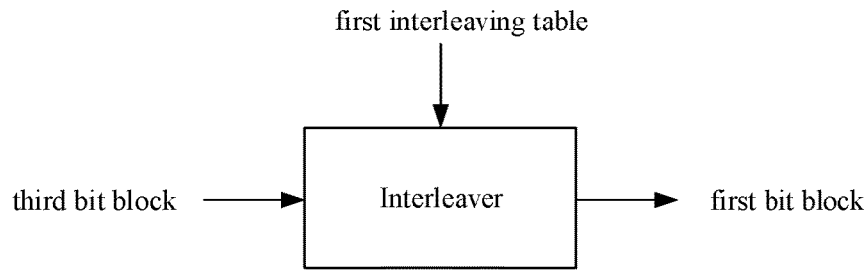
FIG. 10 is a schematic diagram illustrating interleaving a first information block and L check bits according to an embodiment of the present disclosure.
Figure 10:
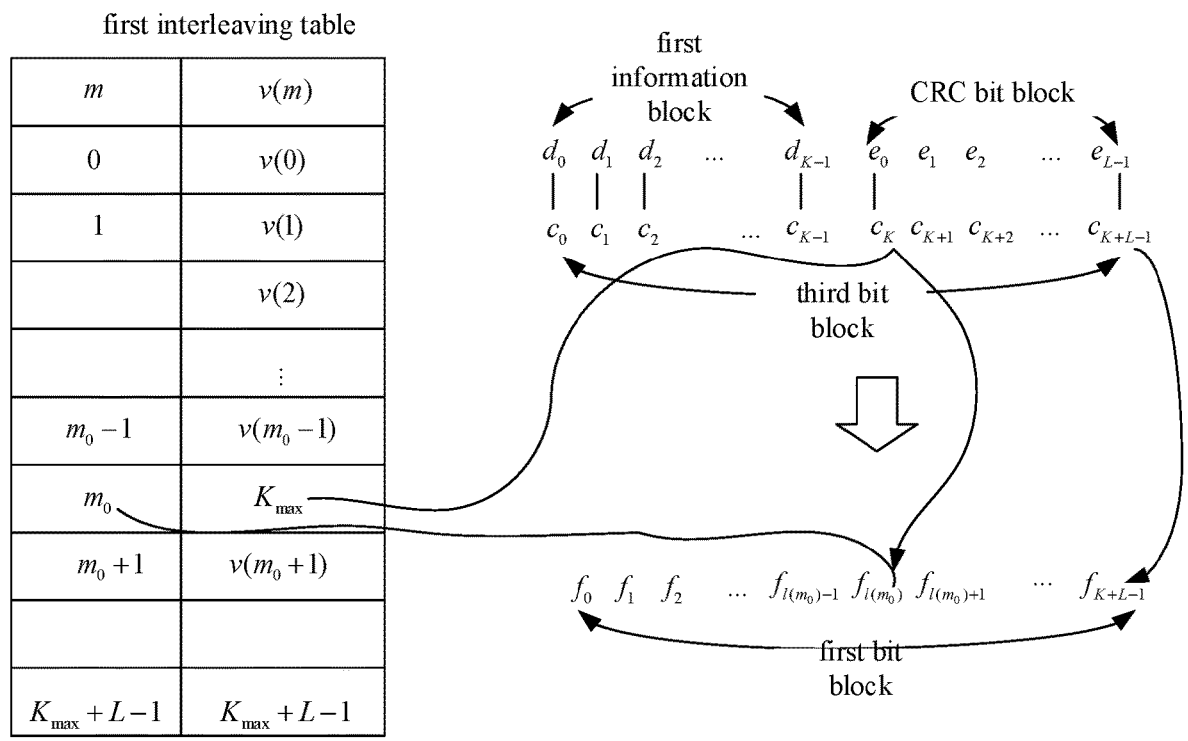

Embodiment 10 illustrates interleaving a first information block and L check bits, as shown in FIG. 10.

In Embodiment 10, the third bit block and the first interleaving table are used as an input of the interleaver module, and the output of the interleaver module is a first bit block consisting of K+L bits $f_0, f_1, \ldots, f_{K+L-1}$. The first information block is formed by cascading K bits $d_0, d_1, \ldots, d_{K-1}$, the CRC bit block is formed by cascading L check bits $e_0, e_1, \ldots, e_{L-1}$ and the third bit block $c_0, c_1, \ldots, c_{K+L-1}$ is formed by sequentially cascading the first information block and the CRC bit block.

In Embodiment 10, the first interleaving table includes a retrieval column (i.e., a column in which m is located) and a numerical column (i.e., a column in which v(m) is located), the retrieval column includes continuous retrieval values that are in one-to-one correspondence with values in the numerical column, the retrieval values are used to sequentially generate bits in the first bit block, the values in the first value set in the numerical column are in one-to-one association with bit positions in the third bit block, and the values in the numerical column are arranged in an ascending order according to its corresponding retrieval values. The number of retrieval values included in the first interleaving table is equal to a maximum possible value $K_{max+L}$ of the number of bits in the third bit block, where $K_{max}$ is the maximum possible value of the number of bits in the first information block.

In Embodiment 10, when $K=K_{max}$, the bits with the sequence number equal to v(m) in the third bit block are placed in the bit position with the sequence number equal to m in the first bit block; when $K<K_{max}$, the bit with the sequence number equal to $v(m)-(K_{max}-K)$ in the third bit block are sequentially placed in the first bit block in an ascending order of m corresponding to v(m), where v(m) needs to meet the condition $v(m) \geq K_{max}-K$, and the values of $v(m)<K_{max}-K$ in the numerical column are not used to interleave the bits in the third bit block.

In Embodiment 10, the first check bit is a bit which is positioned front-most in the third bit block among the L check bits. The first check bit is also a bit which is positioned front-most in the first bit block among the L check bits. The corresponding value of the first check bit in the first interleaving table is Kmax. The retrieval value corresponding to the value Kmax is m0. The corresponding sequence number of the m0 in the first bit block is 1(m0), which depends on the value of K. The previous adjacent bit and the next adjacent bit of the first check bit in the first bit block are bits in the first information block.

In one embodiment, the positions of the at least two check bits among the L check bits in the first bit block are discontinuous.

In one embodiment, the value of any one of the L check bits is unrelated to the bits whose position is subsequent to the check bit among the first bit block in the first information block.

In one embodiment, the value of any one of the L check bits can only be related to the bits whose position is prior to the check bit among the first bit block in the first information block, without being related to the bits whose position is subsequent to the check bit among the first bit block in the first information block.

In one embodiment, the value of any one of the L check bits is only related to the bits whose position is prior to the check bit among the first bit block in the first information block.

In one embodiment, the first bit block does not include frozen bits.

Embodiment 11

Figure 11:
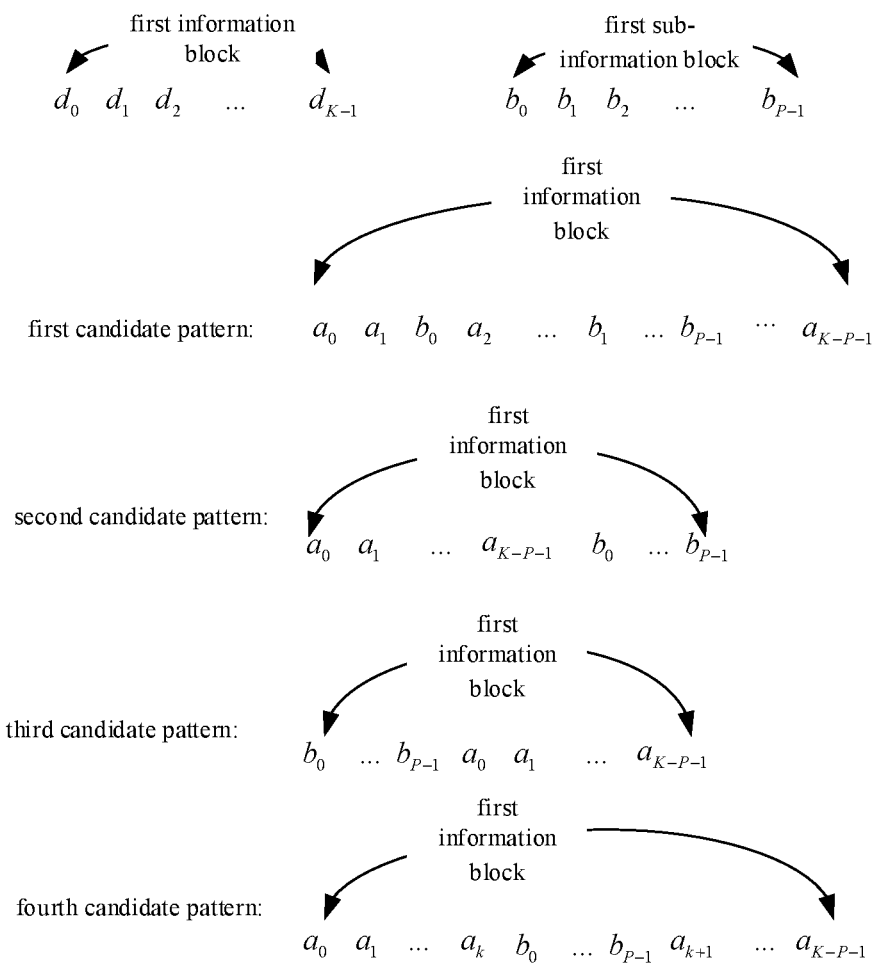
FIG. 11 is a schematic diagram illustrating the position of a first sub-information-block in a first information block according to an embodiment of the present disclosure.

Embodiment 11 illustrates the position of the first sub-information-block in the first information block, as shown in FIG. 11.

In Embodiment 11, the first information block is formed by cascading K bits $d_0, d_1, \ldots, d_{K-1}$, and the first sub-information-block is formed by cascading P bits $b_0, b_1, \ldots, b_{P-1}$. The $b_0, b_1 i, \ldots, b_{P-1}$ are $d_0, d_1, \ldots, d_{K-1}$ among the K bits. $a_0, a_1, a_{K-P-1}$ are K-P bits other than the bits in the first sub-information-block in the first information block.

FIG. 11 illustrates four types of candidate patterns of bits in the first sub-information-block in the first information block in Embodiment 11. In the first type of candidate patterns, the b0, b1, . . . , bP−1 are discontinuous P bits in the first information block; in the second type of candidate patterns, the b0, b1, . . . , bP−1 are front-most continuous P bits in the first information block; in the third type of candidate patterns, the b0, b1, . . . , bP−1 are continuous P bits that are positioned last in the first information block; and in the fourth type of candidate patterns, the b0, b1, . . . , bP−1 are continuous P bits in the first information block, and the b0, b1, . . . , bP−1 do not include the first bit and the last bit in the first information block.

Embodiment 12

Figure 12:
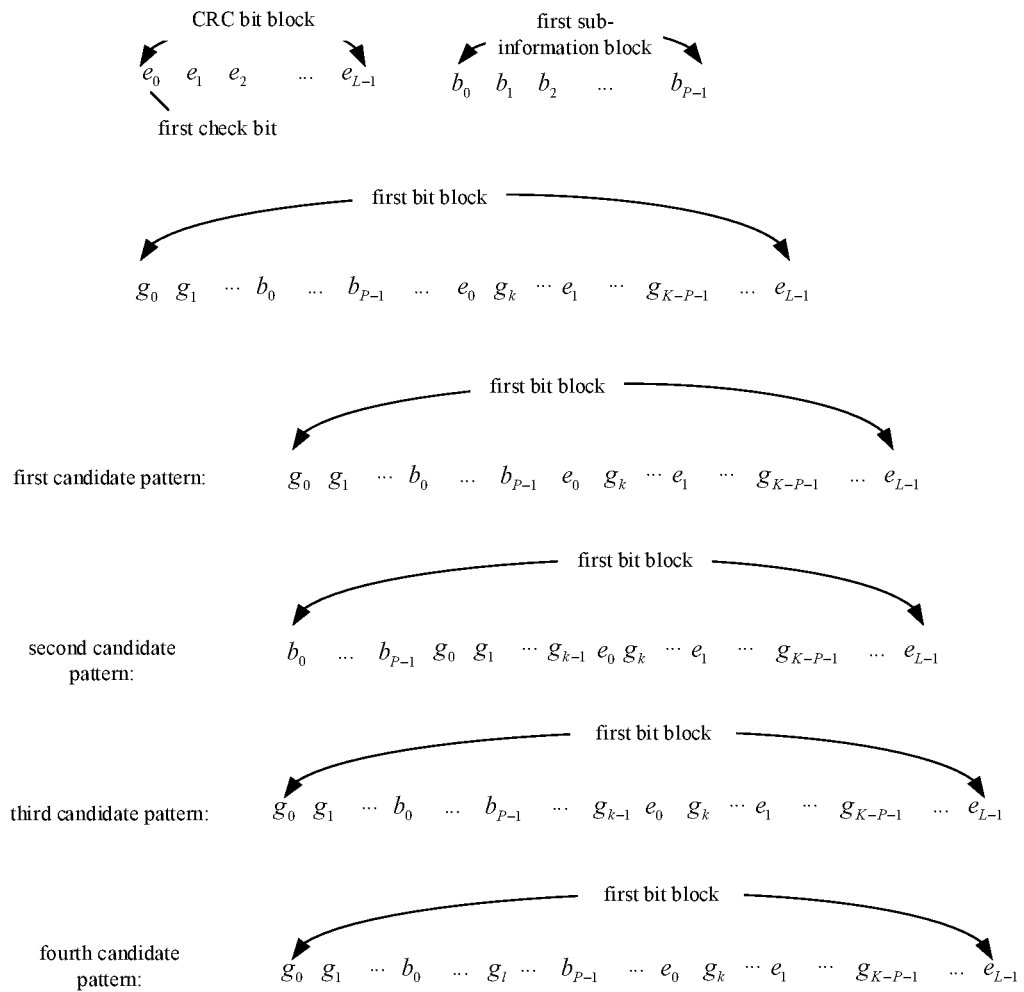
FIG. 12 is a schematic diagram illustrating the position of a first sub-information-block in a first bit block according to an embodiment of the present disclosure.

Embodiment 12 illustrates the position of the first sub-information-block in the first information block, as shown in FIG. 12.

In Embodiment 12, the first sub-information-block is formed by cascading P bits $b_0, b_1, \ldots, b_{P-1}$, the CRC bit block is formed by cascading L check bits $e_0, e_1, \ldots, e_{L-1}$, the first information block includes bits in the first sub-information-block, and the first information block and the CRC bit block are sequentially mapped into the first bit block after being interleaved. The number of bits in the first information block is K. The first bit block consists of bits in the first sub-information-block, bits in the CRC bit block, and bits $g_0, g_1, \ldots, g_{K-P-1}$ in other first information blocks other than bits in the first sub-information-block. The first bit $e_0$ in the CRC bit block is the first check bit. $e_0$ is also the check bit of the bits in the CRC bit block whose position is front-most in the first bit block.

In Embodiment 12, the first information block and the CRC bit block are sequentially mapped into the first bit block after being interleaved, the positions of the bits $b_0, b_1, \ldots, b_{P-1}$ in the first sub-information-block in the first bit block are prior to the first check bit, the first check bit is a check bit whose position is front-most among the L check bits in the first bit block $e_0$, and both the previous adjacent bit and the next adjacent bit of the first check bit $e_0$ in the first bit block are bits in the first information block. In the first bit block, a bit prior to the first check bit $e_0$ is used to generate the first check bit $e_0$, and a bit after the first check bit $e_0$ is not used to generate the first check bit $e_0$.

FIG. 12 illustrates four types of candidate patterns of bits in the first sub-information-block in the first bit block in Embodiment 12. In the first type of candidate patterns, the $b_0, b_1, \ldots, b_{P-1}$ are continuous P bits closest to $e_0$ in the first bit block; in the second type of candidate patterns, the $b_0, b_1, \ldots, b_{P-1}$ are front-most continuous P bits in the first bit block; in the third type of candidate patterns, the $b_0, b_1, \ldots, b_{P-1}$ are continuous P bits in the first bit block, and the $b_0, b_1, \ldots, b_{P-1}$ neither include bits closest to $e_0$ in the first bit block nor the first bit in the first bit block; and in the fourth type of candidate patterns, and the $b_0, b_1, \ldots, b_{P-1}$ are discontinuous P bits in the first information block.

Embodiment 13

Figure 13:
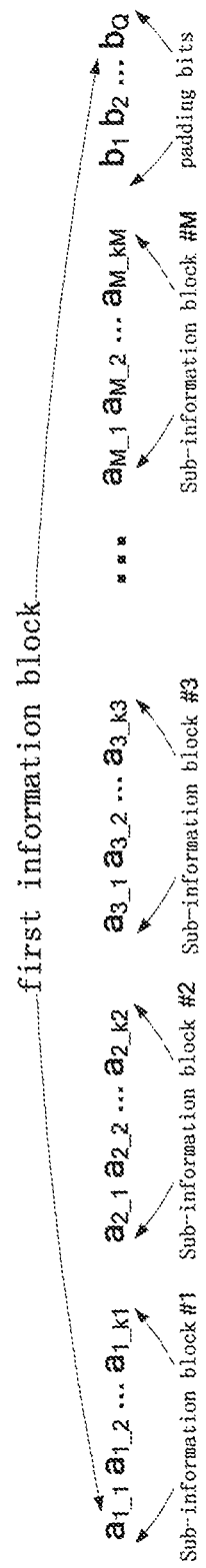
FIG. 13 is a schematic diagram illustrating a first information block according to one embodiment of the present disclosure.

Embodiment 13 is a schematic diagram illustrating a first information block according to the present disclosure, as shown in FIG. 13. In FIG. 13, the first information block is formed by sequentially cascading M sub-information-blocks (i.e., sub-information-block #1, sub-information-block #2, . . . , sub-information-block # M) and Q padding bits; the sub-information-block #1, the sub-information-block #2, . . . , the sub-information-block #M correspond to the bit sequence $\{a_{1\_1}\ a_{1\_2}\ \ldots\ , a_{1\_k1}\}, \{a_{2\_1}\ a_{2\_2}, \ldots\ a_{2\_k2}\}, \ldots, \{a_{M\_1}\ a_{M\_2} \ldots a_{M\_kM}\}$, respectively; the padding bits are the bit sequence $\{b_1\ i\ b_2\ \ldots\ b_Q\}$, and the total number of bits in the M sub-information-blocks is equal to the sum of k1, k2, . . . , kM.

In Sub-embodiment 1 of Embodiment 13, if the number of bits in the first information block (i.e., the sum of k1, k2, . . . , kM, and Q) is M2, the first sub-information-block is sub-information-block #i; if the number of bits in the first information block is M3, the first sub-information-block is sub-information-block #j; the M2 and the M3 are not equal, the i and the j are not equal, and i and j are positive integers not greater than M, respectively.

In Sub-embodiment 2 of the embodiment 13, the sequential relationship of any two sub-information-blocks in the first information block other than the first sub-information-block in the first information block is unrelated to the number of bits in the first information block.

In Sub-embodiment 3 of Embodiment 13, the sequential relationship of at least two sub-information-blocks in the first information block other than the first sub-information-block in the first information block is related to the number of bits in the first information block.

In Sub-embodiment 4 of Embodiment 13, the meaning of at least one of the M sub-information-blocks is related to the number of bits in the first information block.

In Sub-embodiment 5 of Embodiment 13, M is related to the number of bits in the first information block.

In Sub-embodiment 6 of Embodiment 13, the first information block is a DCI, and the M sub-information-blocks correspond to M fields in the DCI, respectively.

In Sub-embodiment 7 of the embodiment 13, the first sub-information-block is the sub-information-block #1.

In Sub-embodiment 8 of Embodiment 13, the first sub-information-block is the sub-information-block #M.

In one embodiment, the meaning of the M sub-information-blocks is related to the DCI format corresponding to the first information block.

In one embodiment, the M fields include one or more of the following fields:

Resource Allocation;
Modulation coding Status (MCS);
Carrier Indicator Field (CIF);
Transmission Power Control (TPC);
Hybrid Automatic Repeat Request (HARQ) Process Number;
Redundancy Version (RV);
New Data Indicator (NDI);
Bandwidth Part (BWP) indication;
Sounding Reference Signal Resource Indicator (SRI);
Transmission Precoding Matrix Indicator (TPMI);
Aperiodic Channel Status Information (A-CSI) trigger;
Aperiodic Sounding Reference Signal (A-SRS) trigger;
Demodulation Reference Signal (DMRS) configuration information.

Embodiment 14

Figure 14:
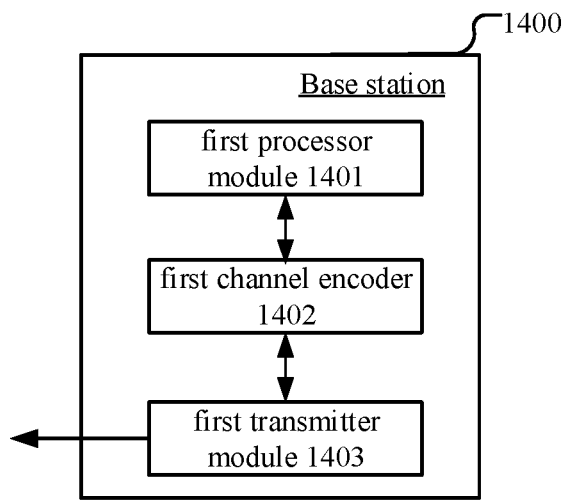
FIG. 14 is a block diagram illustrating the structure of a processing device in a base station according to an embodiment of the present disclosure.

Embodiment 14 is a block diagram illustrating the structure of a processing device in a base station, as shown in FIG. 14. In FIG. 14, the base station processing device 1401 mainly consists of a first processor module 1401, a first channel encoder 1402, and a first transmitter module 1403.

In Embodiment 14, the first processor module 1401 generates a first information block; the first channel encoder 1402 performs first channel coding; and the first transmitter module 1403 transmits a first radio signal.

In Embodiment 14, the first information block includes K bits consisting of bits in M sub-information-blocks and Q padding bits, where the M is a positive integer greater than one, Q is a non-negative integer, and K is a positive integer greater than one; a first bit block is used for an input of the first channel coding, the first channel coding is based on a polar code, the first bit block includes the K bits and L check bits, and the first information block is used to generate the L check bits, where L is a positive integer; the output of the first channel coding is used to generate a first radio signal; any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the first processor module 1401 determines the position of the P bits in the first information block; wherein the position of the P bits in the first information block ensures that the positions of the P bits in the first bit block are prior to the first check bit.

In one embodiment, the positions of the P bits in the first bit block are continuous, and the positions of the P bits in the first information block are also continuous.

In one embodiment, the P bits are P bits whose position is front-most in the first bit block among the bits constituting the first information block.

In one embodiment, the P bits are the P bits that are positioned last in the first information block.

In one embodiment, the position of the P bits in the first information block is related to the number of bits in the first information block.

In one embodiment, the relative positions between the P bits and the first check bit in the first bit block is unrelated to the number of bits in the first information block.

In one embodiment, the relative positions between the P bits and the first check bit in the first bit block is related to the number of bits in the first information block.

In one embodiment, the positions of the Q padding bits in the first information block are discontinuous.

In one embodiment, the first processor module 1401 includes the controller/processor 440 in Embodiment 4.

In one embodiment, the first processor module 1401 includes the transmitting processor 415 in Embodiment 4.

In one embodiment, the first channel encoder 1402 includes the transmitting processor 415 in Embodiment 4.

In one embodiment, the first channel encoder 1402 includes the controller/processor 440 in Embodiment 4.

In one embodiment, the first transmitter module 1403 includes the MIMO transmitting processor 441 in Embodiment 4.

In one embodiment, the first transmitter module 1403 includes the transmitter/receiver 416 and the antenna 420 in Embodiment 4.

Embodiment 15

Figure 15:
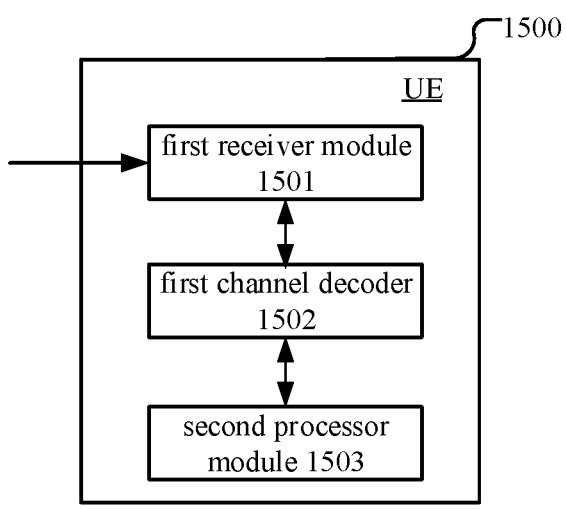
FIG. 15 is a block diagram illustrating the structure of a processing device in UE according to an embodiment of the present disclosure.

Embodiment 15 is a block diagram illustrating the structure of a processing device in UE, as shown in FIG. 15. In FIG. 15, the UE processing device 1500 mainly consists of a first receiver module 1501, a first channel decoder 1502, and a second processor module 1503.

In Embodiment 15, the first receiver module 1501 receives the first radio signal, the first channel decoder 1502 performs the first channel decoding, and the second processor module 1503 recovers the first information block.

In Embodiment 15, the first radio signal is used for an input of first channel decoding; the first channel decoding corresponds to first channel coding, the first channel coding is based on a polar code, and a first bit block is used for an input of the first channel coding; the first information block includes K bits consisting of bits in M sub-information-blocks and Q padding bits, the first bit block includes the K bits and L check bits, and the first information block is used to generate the L check bits, where M and K are both positive integers greater than 1, Q is a non-negative integer, and L is a positive integer; any one of the M sub-information-blocks consists of a positive integer number of bits, the first sub-information-block is a sub-information-block of the M sub-information-blocks, and the first sub-information-block consists of P bits, where P is a positive integer; the value of the first sub-information-block is related to the information format of the first information block, or the value of the first sub-information-block is related to Q; the first information block and the L check bits are sequentially mapped into the first bit block after being interleaved, the positions of the P bits in the first bit block are prior to the first check bit, the first check bit is a check bit whose position is front-most among the L check bits in the first bit block, and both the previous adjacent bit and the next adjacent bit of the first check bit in the first bit block are bits in the first information block.

In one embodiment, the first channel decoder 1502 obtains the P bits by decoding; wherein the positions of the P bits in the first bit block are prior to the first check bit.

In one embodiment, the positions of the P bits in the first bit block are continuous, and the positions of the P bits in the first information block are also continuous.

In one embodiment, the P bits are P bits whose position is front-most in the first bit block among the bits constituting the first information block.

In one embodiment, the P bits are the P bits that are positioned last in the first information block.

In one embodiment, the position of the P bits in the first information block is related to the number of bits in the first information block.

In one embodiment, the relative positions between the P bits and the first check bit in the first bit block is unrelated to the number of bits in the first information block.

In one embodiment, the relative positions between the P bits and the first check bit in the first bit block is related to the number of bits in the first information block.

In one embodiment, the positions of the Q padding bits in the first information block are discontinuous.

In one embodiment, the second processor module 1503 includes the controller/processor 490 in Embodiment 4.

In one embodiment, the second processor module 1503 includes the memory 480 in Embodiment 4.

In one embodiment, the second processor module 1503 includes the receiving processor 452 in Embodiment 4.

In one embodiment, the first channel decoder 1502 includes the receiving processor 452 in Embodiment 4.

In one embodiment, the first channel decoder 1502 includes the controller/processor 490 in Embodiment 4.

In one embodiment, the first receiver module 1501 includes the MIMO detector 472 in Embodiment 4.

In one embodiment, the first receiver module 1501 includes the transmitter/receiver 456 and the antenna 460 in Embodiment 4.

The ordinary skill in the art may understand that all or part steps in the above method may be implemented by instructing related hardware through a program. The program may be stored in a computer-readable storage medium, for example Read-Only Memory (ROM), hard disk or compact disc, etc. Optionally, all or part steps in the above embodiments also may be implemented by one or more integrated circuits. Correspondingly, each module unit in the above embodiment may be realized in the form of hardware, or in the form of software function modules. The present disclosure is not limited to any combination of hardware and software in specific forms. The UE and terminal in the present disclosure include but not limited to mobile phones, unmanned aerial vehicles with a communication module, aircrafts with a communication module, cars with a communication module, tablet computers, notebooks, network cards, narrowband Internet of Things (NB-IOT) terminals, eMTC terminals, and other wireless communication devices. The base station or system equipment in the present disclosure includes but not limited to gNB, macro-cellular base stations, micro-cellular base stations, home base stations, relay base stations, and other wireless communication devices.

The above are merely the preferred embodiments of the present disclosure and are not intended to limit the scope of protection of the present disclosure. Any modification, equivalent substitute and improvement made within the spirit and principle of the present disclosure are intended to be included within the scope of protection of the present disclosure.

What is claimed is:

1. A method performed in base station equipment for wireless communication, comprising:

generating a first information block, wherein the first information block comprises K bits consisting of bits in M sub-information-blocks and Q padding bits, where M is a positive integer greater than one, Q is a non-negative integer, and K is a positive integer greater than one;

performing first channel coding, wherein a first bit block is used as an input for the first channel coding, the first channel coding is based on a polar code, the first bit block comprises the K bits and L check bits, and the first information block is used to generate the L check bits, where L is a positive integer; and transmitting a first radio signal, wherein the output of the first channel coding is used to generate the first radio signal;

wherein any one of the M sub-information-blocks consists of a positive integer number of bits, a first sub-information-block is a sub-information-block of the M sub-information-blocks, and the first sub-information-block consists of P bits, where P is a positive integer; a value of the first sub-information-block is related to an information format of the first information block, or the value of the first sub-information-block is related to Q; the first information block and the L check bits are sequentially mapped into the first bit block after being interleaved, the positions of the P bits in the first bit block are prior to a first check bit, the first check bit is a check bit whose position is front-most among the L check bits in the first bit block, and both the previous adjacent bit and the next adjacent bit of the first check bit in the first bit block are bits in the first information block.

2. The method according to claim 1, comprising:

determining the position of the P bits in the first information block;

wherein the position of the P bits in the first information block ensures that the positions of the P bits in the first bit block are prior to the first check bit.

3. The method according to claim 1, wherein the positions of the P bits in the first bit block are continuous, and the positions of the P bits in the first information block are also continuous.

4. The method according to claim 1, wherein the P bits are P bits whose positions are front-most in the first bit block among the bits constituting the first information block.

5. The method according to claim 1, wherein the positions of the Q padding bits in the first information block are discontinuous.

6. A method performed in user equipment for wireless communication, comprising:

receiving a first radio signal, wherein the first radio signal is used as an input for a first channel decoding;

performing the first channel decoding, wherein the first channel decoding corresponds to first channel coding, the first channel coding is based on a polar code, and a first bit block is used for an input of the first channel coding; and recovering a first information block, wherein the first information block comprises K bits consisting of bits in M sub-information-blocks and Q padding bits, the first bit block comprises the K bits and L check bits, and the first information block is used to generate the L check bits, where M and K are both positive integers greater than 1, Q is a non-negative integer, and L is a positive integer;

wherein any one of the M sub-information-blocks consists of a positive integer number of bits, a first sub-information-block is a sub-information-block of the M sub-information-blocks, and the first sub-information-block consists of P bits, where P is a positive integer; a value of the first sub-information-block is related to an information format of the first information block, or the value of the first sub-information-block is related to Q; the first information block and the L check bits are sequentially mapped into the first bit block after being interleaved, the positions of the P bits in the first bit block are prior to a first check bit, the first check bit is a check bit whose position is front-most among the L check bits in the first bit block, and both the previous adjacent bit and the next adjacent bit of the first check bit in the first bit block are bits in the first information block.

7. The method according to claim 6, comprising:
obtaining the P bits by decoding;
wherein the positions of the P bits in the first bit block are prior to the first check bit.

8. The method according to claim 6, wherein the positions of the P bits in the first bit block are continuous, and the positions of the P bits in the first information block are also continuous.

9. The method according to claim 6, wherein the P bits are P bits whose positions are front-most in the first bit block among the bits constituting the first information block.

10. The method according to claim 6, wherein the positions of the Q padding bits in the first information block are discontinuous.

11. Base station equipment for wireless communication, comprising:
a first processor module configured to generate a first information block, wherein the first information block comprises K bits consisting of bits in M sub-information-blocks and Q padding bits, where M is a positive integer greater than one, Q is a non-negative integer, and K is a positive integer greater than one;
a first channel encoder configured to perform first channel coding, wherein a first bit block is used as an input for the first channel coding, the first channel coding is based on a polar code, the first bit block comprises the K bits and L check bits, and the first information block is used to generate the L check bits, where L is a positive integer; and
a first transmitter module configured to transmit a first radio signal, wherein the output of the first channel coding is used to generate the first radio signal;
wherein any one of the M sub-information-blocks consists of a positive integer number of bits, a first sub-information-block is a sub-information-block of the M sub-information-blocks, and the first sub-information-block consists of P bits, where P is a positive integer; a value of the first sub-information-block is related to an information format of the first information block, or the value of the first sub-information-block is related to Q; the first information block and the L check bits are sequentially mapped into the first bit block after being interleaved, the positions of the P bits in the first bit block are prior to a first check bit, the first check bit is a check bit whose position is front-most among the L check bits in the first bit block, and both the previous adjacent bit and the next adjacent bit of the first check bit in the first bit block are bits in the first information block.

12. The base station equipment according to claim 11, wherein the position of the P bits in the first information block ensures that the positions of the P bits in the first bit block are prior to the first check bit.

13. The base station equipment according to claim 11, wherein the positions of the P bits in the first bit block are continuous, and the positions of the P bits in the first information block are also continuous.

14. The base station equipment according to claim 11, wherein the P bits are P bits whose position is front-most in the first bit block among the bits constituting the first information block.

15. The base station equipment according to claim 11, wherein the positions of the Q padding bits in the first information block are discontinuous.

16. User equipment for wireless communication, comprising:
a first receiver module configured to receive a first radio signal, wherein the first radio signal is used as an input for a first channel decoding;
a first channel decoder configured to perform the first channel decoding, wherein the first channel decoding corresponds to first channel coding, the first channel coding is based on a polar code, and a first bit block is used for an input of the first channel coding; and
a second processor module configured to recover a first information block, wherein the first information block comprises K bits consisting of bits in M sub-information-blocks and Q padding bits, the first bit block comprises the K bits and L check bits, and the first information block is used to generate the L check bits, where M and K are both positive integers greater than 1, Q is a non-negative integer, and L is a positive integer;
wherein any one of the M sub-information-blocks consists of a positive integer number of bits, a first sub-information-block is a sub-information-block of the M sub-information-blocks, and the first sub-information-block consists of P bits, where P is a positive integer; a value of the first sub-information-block is related to an information format of the first information block, or the value of the first sub-information-block is related to Q; the first information block and the L check bits are sequentially mapped into the first bit block after being interleaved, the positions of the P bits in the first bit block are prior to a first check bit, the first check bit is a check bit whose position is front-most among the L check bits in the first bit block, and both the previous adjacent bit and the next adjacent bit of the first check bit in the first bit block are bits in the first information block.

17. The user equipment according to claim 16,
wherein the positions of the P bits in the first bit block are prior to the first check bit.

18. The user equipment according to claim 16, wherein the positions of the P bits in the first bit block are continuous, and the positions of the P bits in the first information block are also continuous.

19. The user equipment according to claim 16, wherein the P bits are P bits whose position is front-most in the first bit block among the bits constituting the first information block.

20. The user equipment according to claim 16, wherein the positions of the Q padding bits in the first information block are discontinuous.

* * * * *